United States Patent
Okumura et al.

(10) Patent No.: US 8,450,819 B2
(45) Date of Patent: May 28, 2013

(54) PLASMA DOPING METHOD AND APPARATUS THEREOF

(75) Inventors: Tomohiro Okumura, Osaka (JP); Mitsuo Saitoh, Osaka (JP); Ichiro Nakayama, Osaka (JP); Taro Kitaoka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/291,186

(22) Filed: Nov. 8, 2011

(65) Prior Publication Data

US 2012/0115317 A1    May 10, 2012

(30) Foreign Application Priority Data

Nov. 9, 2010  (JP) ................................. 2010-250440

(51) Int. Cl.
- *H01L 27/14* (2006.01)
- *H01L 21/44* (2006.01)

(52) U.S. Cl.
USPC .......................................... 257/428; 438/680

(58) Field of Classification Search
USPC ............... 438/59–63, 680; 257/428, 607, E31.001–E31.131; 118/723 E, 725
See application file for complete search history.

(56) References Cited

U.S. PATENT DOCUMENTS

| 4,912,065 A | 3/1990 | Mizuno et al. |
| 5,372,648 A * | 12/1994 | Yamamoto et al. ....... 118/723 E |
| 2003/0166328 A1 | 9/2003 | Mizuno et al. |
| 2004/0045507 A1 | 3/2004 | Okumura et al. |
| 2006/0219952 A1 | 10/2006 | Mehta et al. |
| 2007/0176124 A1 | 8/2007 | Sasaki et al. |
| 2012/0058649 A1 * | 3/2012 | Okumura et al. ............. 438/798 |

FOREIGN PATENT DOCUMENTS

| JP | 9-115851 | 5/1997 |
| JP | 2004-47695 | 2/2004 |
| JP | 2006-196752 | 7/2006 |
| JP | 2008-53634 | 3/2008 |
| JP | 2005-260139 | 9/2009 |
| WO | 2006/121131 | 11/2006 |

OTHER PUBLICATIONS

Kazuya Matsumoto et al., "Activation of B and As in Ultrashallow Junction During Millisecond Annealing Induced by Thermal Plasma Jet Irradiation", Japanese Journal of Applied Physics, 49(2010) 04DA02, pp. 1-4, 2010.

* cited by examiner

*Primary Examiner* — Calvin Lee
(74) *Attorney, Agent, or Firm* — Wenderoth, Lind & Ponack, L.L.P.

(57) ABSTRACT

In a plasma torch unit, a conductor rod having a spiral shape is disposed inside a quartz pipe having a surface coated with boron glass, and a brass block is disposed on the periphery thereof. While a gas is being supplied into a cylindrical chamber, a high-frequency power is supplied to the conductor rod and a plasma is generated in the cylindrical chamber, so that a base material is irradiated with the plasma.

6 Claims, 22 Drawing Sheets

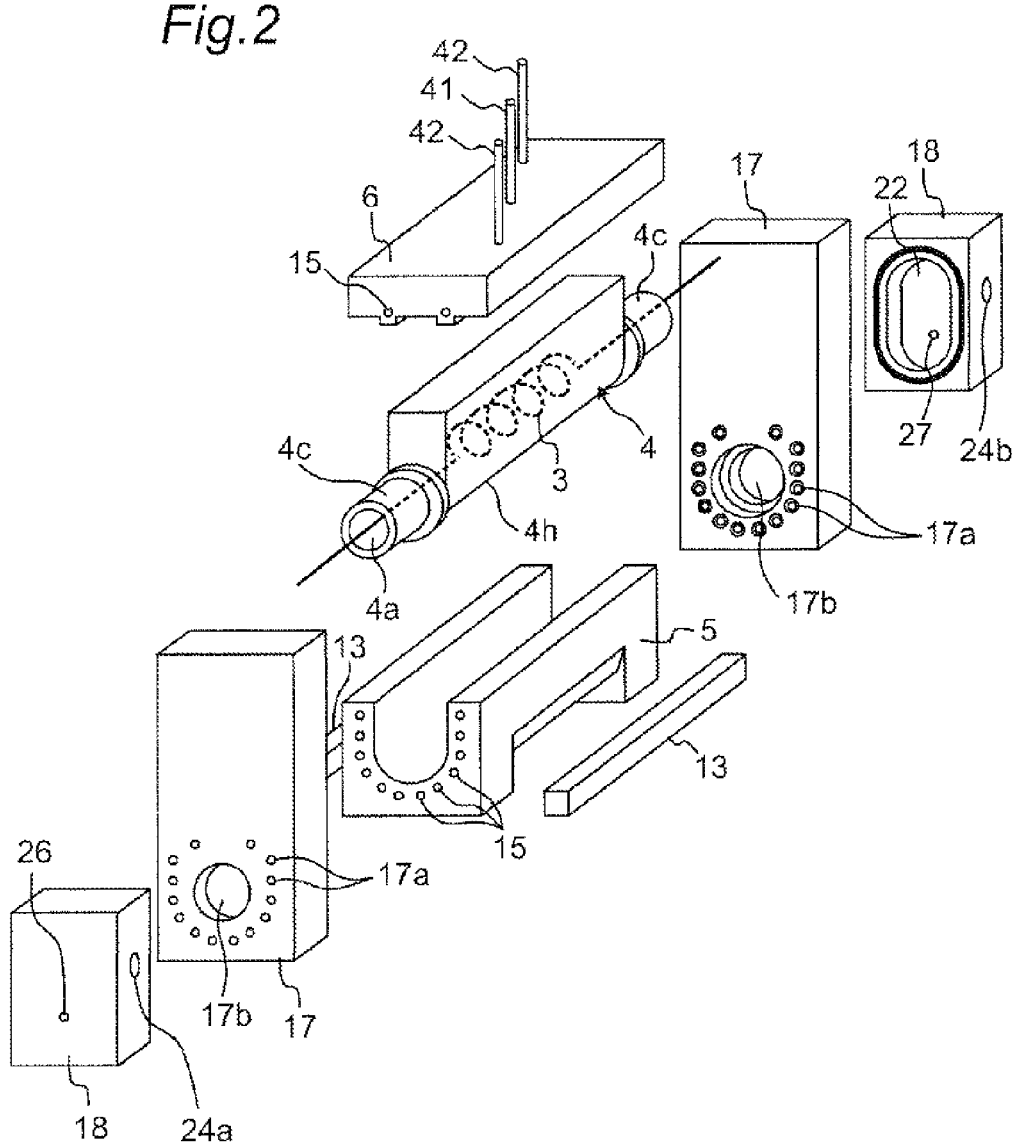

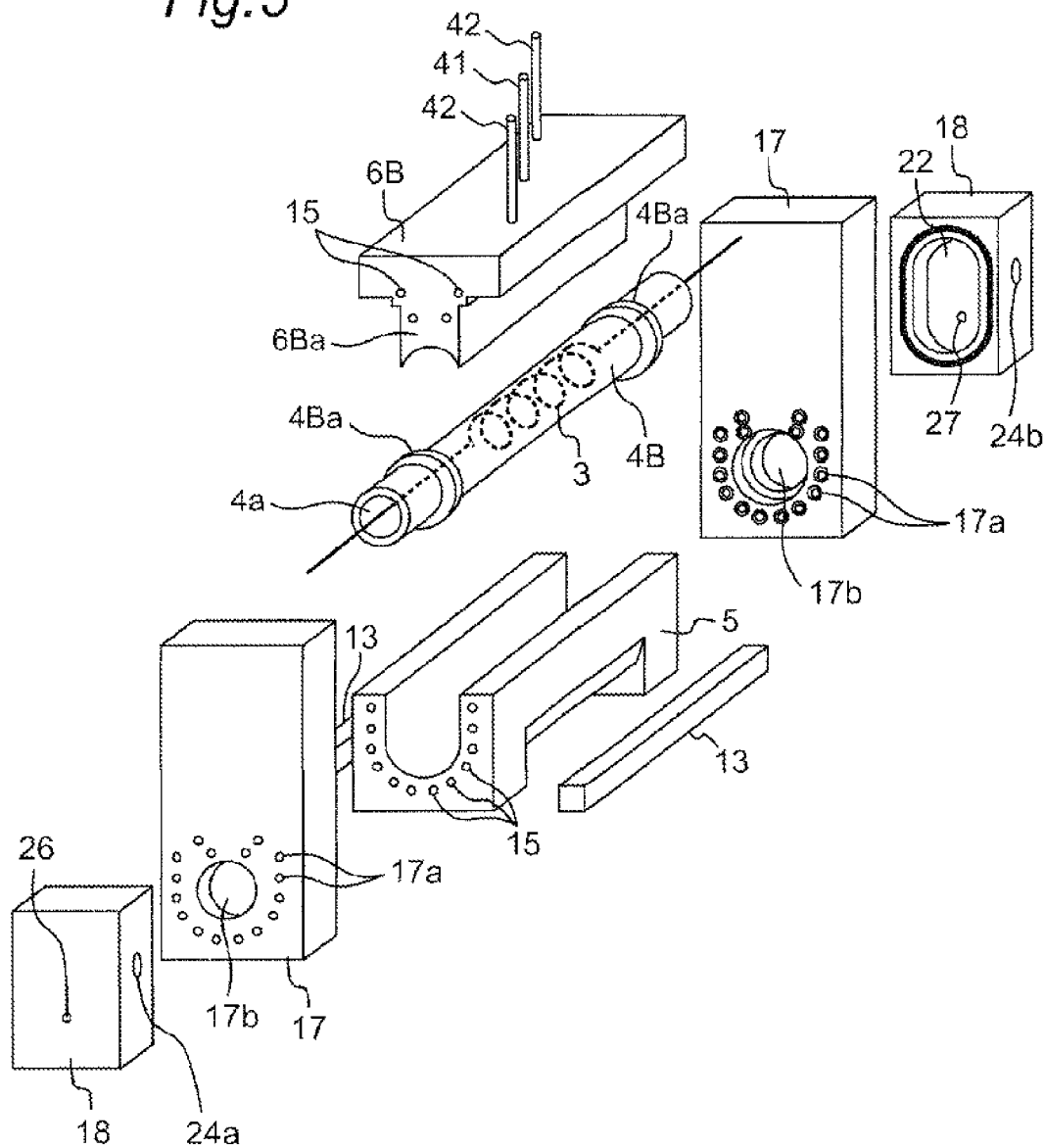

PLASMA DOPING METHOD AND APPARATUS THEREOF

BACKGROUND OF THE INVENTION

The present invention relates to an impurity introduction layer, a junction, and other processed products, and more particularly concerns a forming method of a junction for use in forming an electronic element on a semiconductor substrate to be used in a semiconductor device, a solar battery, or the like, or a plasma doping method and an apparatus thereof for use in introducing an impurity in a junction forming method used for a liquid crystal panel, a solar battery, or the like, and for forming an electronic element on a substrate with a semiconductor thin film formed on its substrate surface.

For example, upon forming an element region on a semiconductor substrate, a large number of pn junctions are used. Moreover, an SOI (Silicon On Insulator) substrate, which has a silicon thin film formed on its substrate surface with an insulating film interposed therebetween, has been widely used in various semiconductor devices such as DRAMs. Furthermore, a glass substrate with a semiconductor thin film formed on its substrate surface has drawn attentions because a small-size and high-speed liquid crystal panel can be obtained by integrating driving circuits for a liquid crystal including thin-film transistors (TFT) into this semiconductor thin film. Further, a semiconductor device having pn junctions formed on a semiconductor substrate or a substrate with a semiconductor thin film formed on its substrate surface has been widely used as a solar battery.

In this manner, upon forming various semiconductor devices, such pn junctions are used. As a method for forming these pn junctions, a method has been conventionally proposed in which after a p-type impurity such as boron has been introduced into an n-type silicon substrate or an n-type silicon thin film by ion implantation, or after an n-type impurity such as phosphorus has been introduced into a p-type silicon substrate or a p-type silicon thin film by ion implantation, an electrically activating process is carried out by a halogen lamp.

As a technique for introducing an impurity onto a surface of a solid-state sample, in addition to the ion implantation method, there has been known a plasma doping method in which an impurity is ionized and introduced into the solid substance with low energy (for example, see U.S. Pat. No. 4,912,065). FIG. 22 illustrates a schematic structure of a plasma doping apparatus for use in a plasma doping method serving as a conventional impurity introducing method, which is described in U.S. Pat. No. 4,912,065. In FIG. 22, a substrate electrode 1, which serves as a base material placing table on which a silicon base material 2 is placed as a base material, is installed in a vacuum container 51. A quartz chamber 52 is installed in the vacuum container 51. While a doping material gas containing a desired element such as $B_2H_6$ is being supplied into the vacuum chamber 51 from a gas supply pipe 53, the inside of the vacuum container 51 is evacuated by an exhaust port 54 so that the inside of the vacuum container can be maintained at a predetermined pressure. A microwave is radiated from a microwave guide tube 55 into the vacuum container 51 through the upper portion of the quartz chamber 52.

By an interaction between this microwave and a DC magnetic field formed by an electromagnet 56 located outside the vacuum container 51, a microwave plasma with a magnetic field (electron cyclotron resonance plasma) 57 is formed in the vacuum container 51. A high-frequency power supply 58 is connected to the substrate electrode 1 through a capacitor 25 so that a potential of the substrate electrode 1 can be controlled. The substrate electrode 1 is water-cooled by cooling water that is introduced from a cooling water inlet 59 and discharged from a cooling water outlet 60. Moreover, the DC potential of the substrate electrode 1 is monitored by a voltmeter 61.

In the plasma doping apparatus having this structure, a doping material gas such as $B_2H_6$ introduced into the vacuum container 51 is formed into a plasma by a plasma generation means configured by the microwave guide tube 55 and the electromagnet 56, and boron ions in a plasma 57 are introduced into the surface of the base material 2 by the high-frequency power supply 58.

In addition to the above method, as the plasma doping method, there has been proposed a method in which, without using a doping material gas, an impurity source of a solid substance is physically sputtered to obtain a doping material for example, see Japanese Unexamined Patent Publication No. 09-115851 and Japanese Unexamined Patent Publication No. 2004-47695), or a method in which an atmospheric pressure plasma is used (for example, see Japanese Unexamined Patent Publication No. 2005-260139).

As the method for electrically activating introduced ions such as boron ions, in addition to using halogen lamp light, a method for radiating xenon flash lamp light, total solid laser light, or excimer laser light has been well known, and a method using a DC plasma jet has also been proposed (for example, see K. Matsumoto et al., "Activation of B and As in Ultrashallow Junction During Millisecond Annealing Induced by Thermal Plasma Jet Irradiation", Japanese Journal of Applied Physics 49 (2010) 04DA02). The DC plasma jet has been proposed as being applicable also to crystallization of a silicon thin film (for example, see Japanese Unexamined Patent Publication. No. 2008-53634).

However, the conventional plasma doping methods have an issue of a complicated structure.

In the plasma doping method described in U.S. Pat. No. 4,912,065 exemplified as a conventional art, a hazardous doping material gas that is a special high-pressure gas, for example, $B_2H_6$, needs to be used, with the result that an additional facility for gas leakage prevention and detection is required. Moreover, in addition to the doping process, an activating process (using another facility) is required in a separated manner.

Moreover, in the plasma doping methods described in Japanese Unexamined Patent Publication No. 09-115851 and Japanese Unexamined Patent Publication No. 2004-47695 exemplified as conventional arts, although the use of special high-pressure gas can be avoided, an activating process (using another facility) is required in a separated manner in addition to the doping process.

Furthermore, in the plasma doping method described in Japanese Unexamined Patent Publication No. 2005-260139 exemplified as a conventional art, a special high-pressure gas needs to be used. Although no vacuum equipment needs to be used in the doping process, an activating process (using another equipment) is required in a separated manner in addition to the doping process.

It is noted that the DC plasma jet described in K. Matsumoto et al., "Activation of B and As in Ultrashallow Junction During Millisecond Annealing Induced by Thermal Plasma Jet Irradiation", Japanese Journal of Applied Physics 49 (2010) 04DA02 and Japanese Unexamined Patent Publication No. 2006-53634 each relate to activating and crystallizing processes, of which object is different from that of the present invention.

In view of these issues described above, an object of the present invention is to provide a plasma doping method and an apparatus thereof having a simple structure, and more specifically, a plasma doping method and an apparatus thereof that need not use a hazardous doping material gas and need not carry out an activating process in a separated manner in addition to a doping process.

SUMMARY OF THE INVENTION

In order to achieve the above object, the present invention provides the following arrangements:

In accordance with one aspect of the present invention, there is provided a plasma doping method comprising:

allowing atoms or molecules to be generated from a solid substance by sublimation caused by heat of a plasma or by chemical etching caused by activator species in the plasma; and irradiating a base material whose surface is a semiconductor with the plasma, to dope the atoms or molecules in the semiconductor, and to simultaneously heat the semiconductor to an activatable temperature so as to be activated.

With this arrangement, it is possible to achieve a plasma doping method that has a simple structure and can activate the semiconductor simultaneously with a doping process. Thus, it is possible to realize a plasma doping method that need not provide an activating process in a separated manner in addition to the doping process.

Preferably, the atoms or molecules contain at least one selected from the group consisting of boron, aluminum, phosphorus, and arsenic, and the semiconductor is preferably made of silicon. With these arrangements, it is possible to achieve pn junctions in a semiconductor device, a solar battery, a liquid crystal panel, and the like in a simple structure.

The plasma is desirably obtained by ionizing a gas containing hydrogen. This arrangement makes it possible to improve the quality of the doping process, and also to achieve high speed operations.

Moreover, powder containing the atoms or molecules may be introduced into a space in which the plasma is generated. With this arrangement, it becomes possible to carry out a stable process for a long period.

Preferably, in the plasma doping method for generating the plasma in the cylindrical chamber by supplying a high-frequency power to a coil while jetting a gas toward the base material from a slit-shaped opening portion formed in the chamber, with the gas being supplied into the chamber, the surface of the base material is desirably processed while the chamber and the base material are being relatively moved in a direction perpendicular to the longitudinal direction of the opening portion. With this arrangement, it is possible to improve the quality of the doping process, and also to provide high-speed operations.

Moreover, one portion of a member that defines the space for use in generating the plasma may be made of a material containing the atoms or molecules so that the atoms or molecules may be partially doped into the semiconductor. This arrangement makes it possible to carry out the doping process only on a desired portion. Alternatively, another arrangement may be made in which one portion of the member that defines the space for use in generating the plasma is made of a material containing the atoms or molecules, with another portion different from the portion of the member being made of a material containing atoms or molecules different from the atoms or molecules, so that the atoms or molecules are partially doped into the semiconductor, while the other atoms or molecules different from the atoms or molecules are doped into a portion different from the portion of the semiconductor. This arrangement makes it possible to dope a plurality of portions with substances that are different from one another.

Preferably, substantially all the portions of the member that defines the space for use in generating the plasma are made of a material containing the atoms or molecules. With this arrangement, it becomes possible to carry cut a stable process for a long period.

In accordance with another aspect of the present invention, there is provided a plasma doping apparatus comprising:

a casing that forms a cylindrical chamber having a slit-shaped opening portion, with a longitudinal direction of the opening portion and a longitudinal direction of the cylindrical chamber being set in parallel with each other;

a gas supply device that supplies a gas into the chamber;

a coil for use in generating a high-frequency electromagnetic field in the chamber;

a high-frequency power supply for supplying a high-frequency power to the coil;

a base material placing table disposed to face the opening portion, on which a base material is placed;

a moving device that relatively moves the chamber and the base material placing table relative to each other in a direction perpendicular to a longitudinal direction of the opening portion; and an elongated member provided at least at one portion of an inner wall surface of the cylindrical chamber, or between the cylindrical chamber and the base material placing table, the member extending in the longitudinal direction of the cylindrical chamber, and being made of a material containing atoms or molecules to be doped, wherein the atoms or molecules are doped in a semiconductor configuring a surface of the base material.

In the plasma doping apparatus according to this aspect of the present invention, the coil is preferably prepared as a solenoid coil, and the extending direction of the coil and the longitudinal direction of the opening portion are desirably made in parallel with each other. With this arrangement, it is possible to improve the quality of the doping process, and to provide high-speed operations. Alternatively, another arrangement may be made in which the coil is configured by a plurality of conductor rods that are disposed in parallel with the longitudinal direction of the cylindrical chamber, with the conductor rods being connected with one another by a conductor link that is disposed perpendicularly to the longitudinal direction of the cylindrical chamber, the conductor rods are inserted into dielectric cylinders, and one portions of the dielectric cylinders are disposed so as to be exposed to a space inside the cylindrical chamber. With this arrangement, it is possible to improve the quality of the doping process, and to provide high-speed operations.

Moreover, one portion of an inner wall surface of the cylindrical chamber may be made of a material containing the atoms or molecules, and another portion different from the portion of the inner wall surface of the cylindrical member may be made of a material containing atoms or molecules different from the atoms or molecules. With this arrangement, it becomes possible to dope a plurality of portions with substances that are different from one another.

Preferably, substantially all the portions of the inner wall surface of the cylindrical chamber are desirably made of a material containing the atoms or molecules. With this arrangement, it becomes possible to carry out a stable process for a long period.

In accordance with the present invention, it is possible to achieve a plasma doping method and an apparatus thereof having a simple structure, and more specifically, a plasma doping method and an apparatus thereof that need not use a hazardous doping material gas, and need not provide an activating process in a separated manner in addition to a doping process.

BRIEF DESCRIPTION OF THE DRAWINGS

These and other aspects and features of the present invention will become clear from the following description taken in conjunction with the preferred embodiments thereof with reference to the accompanying drawings, in which:

FIG. 2 is a perspective view that shows the structure of the plasma doping apparatus in accordance with the first embodiment of the present invention;

FIG. 5 is a perspective view that shows the structure of the plasma doping apparatus in accordance with the second embodiment of the present invention;

FIG. 6 is a perspective view that shows the structure of the plasma doping apparatus in accordance with the third embodiment of the present invention;

DETAILED DESCRIPTION OF THE EMBODIMENTS

Figure 1A:
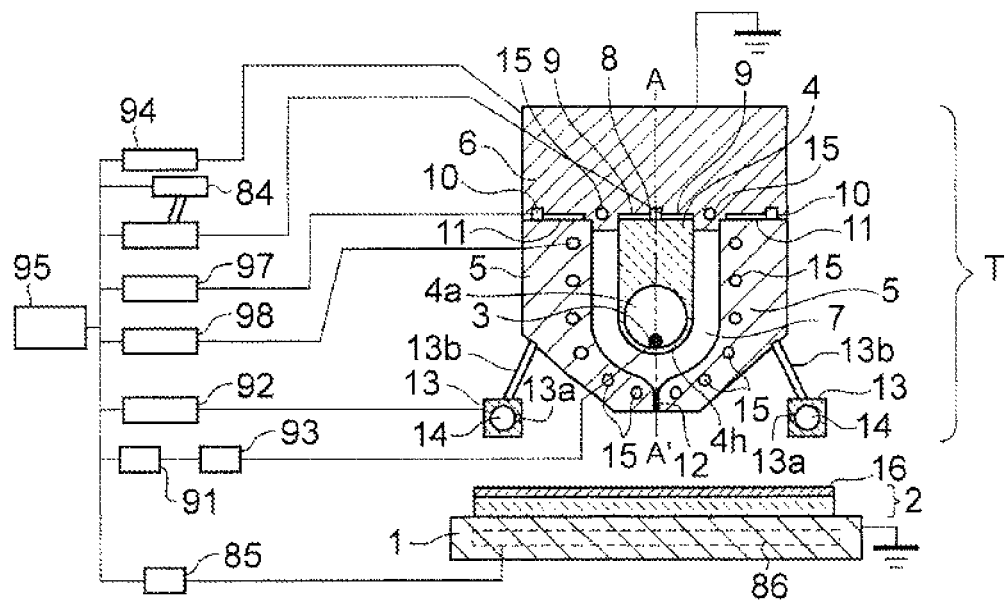
FIG. 1A is a longitudinal cross-sectional side view that shows a structure of a plasma doping apparatus in accordance with a first embodiment of the present invention.

In the following description of the present invention, those members that are the same in the accompanying drawings are denoted by the same reference symbols.

Referring to the drawings, the following will describe plasma doping apparatus in accordance with embodiments of the present invention.

First Embodiment

Figure 3:
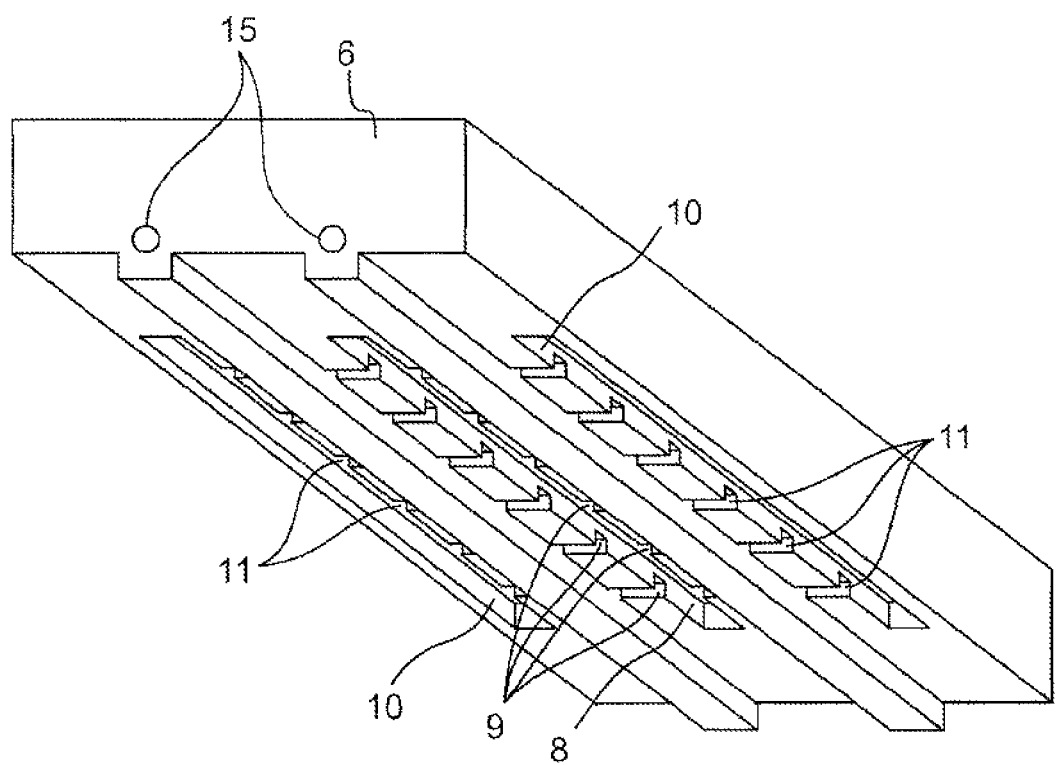
FIG. 3 is a perspective view that shows the structure of the plasma doping apparatus in accordance with the first embodiment of the present invention.

Referring to FIGS. 1 to 3, a first embodiment of the present invention is described below.

In the first embodiment of the present invention, a plasma doping apparatus is exemplified which uses an inductive coupling type plasma torch T.

Figure 1B:
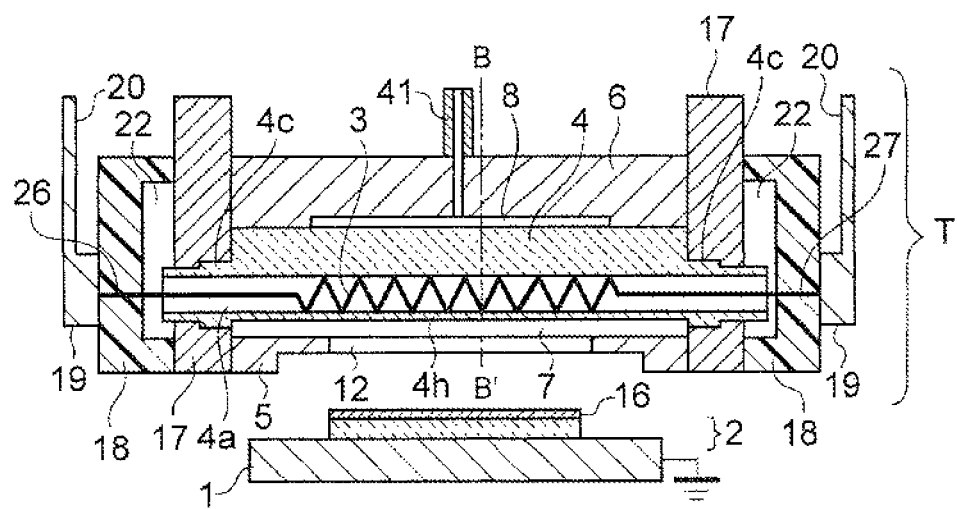
FIG. 1B is a longitudinal cross-sectional front view that shows the structure of the plasma doping apparatus in accordance with the first embodiment of the present invention.

FIG. 1A, which shows a structure of the plasma doping apparatus in the first embodiment of the present invention, is a cross-sectional view taken along a plane perpendicular to the longitudinal direction of the inductive coupling type plasma torch unit T. FIG. 1B is a cross-sectional view taken along a broken line A-A' of FIG. 1A, and this cross-sectional view is taken along a plane that includes a center axis of a solenoid coil 3 and is perpendicular to a surface of a base material 2. It is noted that FIG. 1A is a cross-sectional view taken along a broken line B-B' of FIG. 1B. FIG. 2 is an assembly structural view of the inductive coupling type plasma torch unit T shown in FIGS. 1A and 1B in which perspective views of respective parts are aligned. Moreover, FIG. 3 is a perspective view that shows a lid 6 serving as one constituent part of the inductive coupling type plasma torch unit T, viewed from below.

In FIGS. 1A to 3, the inductive coupling type plasma torch T includes an elongated conductive casing 5, a gas supply device (which is configured by a plasma gas supply device 90, a shield gas supply device 92, and a sheath gas supply device 97), a coil 3, a high frequency power supply 91, a base material placing table 1 to be grounded having a square plate shape, a moving device 94, and a control device 95.

The base material 2 is placed on the base material placing table 1.

In the inductive coupling type plasma torch unit T, an elongated quartz pipe 4 as one example of a dielectric tube or, a dielectric pipe has a longitudinally elongated rectangular shape in longitudinal cross section, and a lower surface is a curved surface formed into an arc shape, with a round through hole 4a that penetrates in the longitudinal direction being formed in a lower portion. The two ends in the longitudinal direction of the quartz pipe 4 have cylinder portions 4c that respectively protrude in the longitudinal direction, and the cylinder portions 4c are respectively fitted into large through holes 17b of brass blocks 17.

A conductor rod 3 having a spiral shape, which forms a solenoid coil, is disposed into the through hole 4a in the quartz pipe 4 in a manner so as to penetrate the quartz pipe 4.

On the periphery of the quartz pipe 4, an elongated brass block 5 is disposed as one example of a conductive casing or device main body block that provides wall surfaces of a cylindrical chamber 7 so as to be spaced apart from each other with predetermined intervals, and the upper side of the quartz pipe 4 is made in contact with the elongated lid 6, for example, made of brass. On a surface of the brass block 5 opposed to the quartz pipe 4 (an inner surface of the brass block 5 which forms the wall surface of the cylindrical chamber 7), there is formed an inner wall surface having a flat portion and a curved portion that correspond to the outer shape of the quartz pipe 4.

Thus, the space (cylindrical chamber) 7 inside the cylindrical chamber configures a long, thin U-letter shaped space having a cylindrical shape that is elongated in the longitudinal direction of the quartz pipe 4, and surrounded by the quartz pipe 4, the brass block 5, the lid 6, and the pair of brass blocks 17 placed on the two ends in the longitudinal direction of the brass block 5. In other words, in the cross-sectional shape of the cylindrical chamber 7 taken along a plane perpendicular to the extending direction of the conductor rod 3, the space inside the cylindrical chamber 7 has a U-letter shape. In this case, the extending direction of the conductor rod 3 is in parallel with a direction of the center axis (the lateral direction in FIG. 1B) of the solenoid coil configured by the conductor rod 3, and corresponds to a direction in which the coil is extended. Since the brass block 5 and the brass lid E are grounded, high-frequency leakage (of noise) can be effectively prevented, and an undesirable abnormal discharge or the like can also be effectively prevented. A plasma generated in the space inside the cylindrical chamber 7 is jetted downward toward the base material 2 through a plasma jetting port 12 as one example of a slit-shaped opening in the cylindrical chamber 7. Moreover, the longitudinal direction of the cylindrical chamber 7 and the longitudinal direction of the plasma jetting port 12 are made in parallel with each other. The plasma jetting port 12, which is an opening having the same size as the lower end opening of the cylindrical chamber 7 of the quartz pipe 4, is formed at a lower end portion of the brass block 5.

As shown in FIG. 3, a groove configuring a plasma gas manifold 8 that extends in the longitudinal direction of the brass lid 6 is formed in a surface at the center portion of the lower surface of the brass lid 6 that is opposed to the upper surface in the center portion of the quartz pipe 4. A plasma gas supply pipe 41 is connected to the center portion in the longitudinal direction of the plasma gas manifold 8 from above the brass lid 6, so that a plasma gas can be supplied into the plasma gas manifold 8 from the plasma gas supply device 90 through the plasma gas supply pipe 41. Moreover, a plurality of grooves configuring plasma gas supply holes 9 that connect the plasma gas manifold 8 with the cylindrical chamber 7 are formed on the two sides of the plasma gas manifold 8 in the lateral direction (lateral direction in FIG. 1A) perpendicular to the longitudinal direction of the quartz pipe 4, in the center portion of the lower surface of the brass lid 6, with a predetermined interval, for example. In the inner surface of the lid 6 on the brass block 5 side, counter bores, which configure sheath gas manifolds 10, are formed, and when combined with the brass block 5, a space surrounded by the brass block 5 and the lid 6 configures a closed space that defines the sheath gas manifold 10. Moreover, on the brass block 5, there are formed grooves configuring sheath gas supply holes 11 that extend from each of the sheath gas manifolds 10 in the width direction of the brass block 5 so as to communicate with the inside of the cylindrical chamber 7. The sheath gas supply device 97 is connected to the respective sheath gas manifolds 10 so that a sheath gas (dielectric tube protective gas) can be supplied from the sheath gas supply device 97 controlled by the control device 95 to the sheath gas manifolds 10. The sheath gas supplied to the sheath gas manifolds 10 is introduced into the cylindrical chamber 7 from the sheath gas supply holes 11. As one example of the sheath gas, Ar gas, a mixture gas of Ar and $H_2$, or $N_2$ gas may be used.

Furthermore, a pair of shield gas nozzles 13, as one example of shield gas supply members, are each disposed on a portion close to the base material placing table 1 (in other words, between the corresponding brass block 5 and the base material placing table 1), with the plasma jetting port 12 being interposed therebetween. The paired shield gas nozzles 13 are each supported on the corresponding brass block 5 and secured thereto, for example, by corresponding support arms 13b (not shown). On the surface of each of the shield gas nozzles 13 on the plasma gas jetting port 12 side, a large number of shield gas introducing ports 13a placed in the longitudinal direction are opened, and in the inner portion of each of the shield gas nozzles 13, a shield gas manifold 14 for connecting the shield gas supply device 92 to the large number of shield gas introducing ports 13a, are provided. In this manner, three types of gas introducing systems for a plasma gas, a shield gas, and a sheath gas are prepared so that by appropriately adjusting the gas types, gas flow rates, or the like in a divided manner into a plasma gas suitable for generating plasma and a sheath gas for protecting the inner wall surface of the brass block 5, it is possible to carry out a stable plasma processing operation, and by supplying the shield gas in a separated manner, it is also possible to prevent gases, such as oxygen, carbon dioxide, or the like in the air, which is unnecessary for the processing or causes adverse effects thereto, from being mixed into the plasma irradiation surface.

The inside of the through hole 4a in the quartz pipe 4 in which the conductor rod 3 is disposed is immersed in water serving as an insulating fluid, and water serving as a coolant of the insulating fluid, supplied from a coolant supply device 98, is also allowed to flow the inside of the through hole 4a so that the conductor rod 3 is cooled. Moreover, in the brass block 5 and the lid 6, a large number of cooling water pipes 15 as one example of coolant pipes penetrating these in the longitudinal direction are provided. These water passages (coolant channels) are allowed to communicate with a cooling water manifold 22 serving as a coolant manifold configured by a space between a concave portion of a resin case 18 provided outside each of the end brass blocks 17 respectively disposed at the two ends in the longitudinal direction of the brass block 5 and each of the end brass blocks 17. Each of cooling water inlet/outlet ports 24a and 24b serving as a coolant introducing port and a coolant jetting port which are respectively connected to the coolant supply device 98 is formed at one position of the resin case 18 so that the distribution of the water cooling pipes to the inductive coupling type torch unit T is highly simplified; thus, it is possible to configure a small-size torch. That is, this structure is provided with the two coolant manifolds 22 on the two sides in the longitudinal direction of the cylindrical chamber 7, and the large number of coolant channels 15 which communicate with the two coolant manifolds 22 are provided in the respective members that configure the cylindrical chamber 7. In this case, the through hole 4a inside the quartz pipe 4 is also one of the coolant passages. All the coolant passages 15 and 4a are connected to the coolant manifolds 22 in parallel with one another, and in this structure, each of the coolant introducing ports 24a and each of the coolant jetting ports 24b are respectively attached to one of the two coolant manifolds 22.

Moreover, the cross-sectional area of the connecting portion between the coolant manifold 22 and each of the coolant channels, or the cross-sectional area of the coolant channel itself, is not even, such that the cross-sectional area of the coolant channel 15 formed in the brass block 5 and the lid 6 or each of connecting portions thereof (a large number of small through holes 17a formed in the brass block 17) is small, while the inner diameter (the diameter of the coolant channel) of the through hole 4a of the quartz pipe 4 or the cross-sectional area of a connecting portion thereof (the one large through hole 17b formed in the brass block 17) is made larger. With this structure, the channel cross-sectional area of the through hole 4a in the quartz pipe 4, which is a member requiring a high cooling operation, is made larger so that the total flow rate of the coolant can be reduced.

The conductor rod 3 is connected to copper blocks 19 through a high-frequency introducing terminal hole 26 and a grounding terminal hole 27 formed in the resin case 18 so as to be connected to the high-frequency power supply 91 through a high-frequency matching circuit 93 with copper plates 20 being interpolated therebetween.

An outer surface 4h (a portion configuring the wall surface of the cylindrical chamber 7) of the quartz pipe 4 is coated with a substance containing an element to be desirably doped to the base material 2, with a thickness of, for example, 100 nm or more. For example, in an attempt to dope boron (B), boron glass ($B_2O_3$) may be coated thereon with a thickness of, for example, 100 nm or more. Alternatively, in an attempt to dope aluminum (Al), alumina ($Al_2O_3$) may be coated on the outer surface 4h of the quartz pipe 4 with a thickness of, for example, 100 nm or more. Still alternatively, in an attempt to dope phosphorus (P), phosphorus glass ($P_2O_5$), aluminum metaphosphate ($Al(PO_3)_3$), or $LaP_5O_{14}$ may be coated on the outer surface 4h of the quartz pipe 4 with a thickness of, for example, 100 nm or more. In an attempt to dope arsenic (As), arsenic glass ($As_2O_5$) may be coated on the outer surface 4h of the quartz pipe 4 with a thickness of, for example, 100 nm or more.

In this manner, an insulating material containing atoms or molecules to be desirably doped is formed on the outer surface 4h (a portion configuring the wall surface of the cylindrical chamber 7, which is one portion of a member defining a space in which a plasma is generated) of the quartz pipe 4 by appropriately using a coating method, a vapor deposition method, a spattering method, or the like, with a thickness of, for example, 100 nm or more. Alternatively, instead of forming on the outer surface 4h of the quartz pipe 4, the quartz pipe 4 itself may be made of one of these insulating materials (in this case, the name of the member is referred to not as "quartz pipe", but as a name including the name of a material to be used).

Figure 1C:
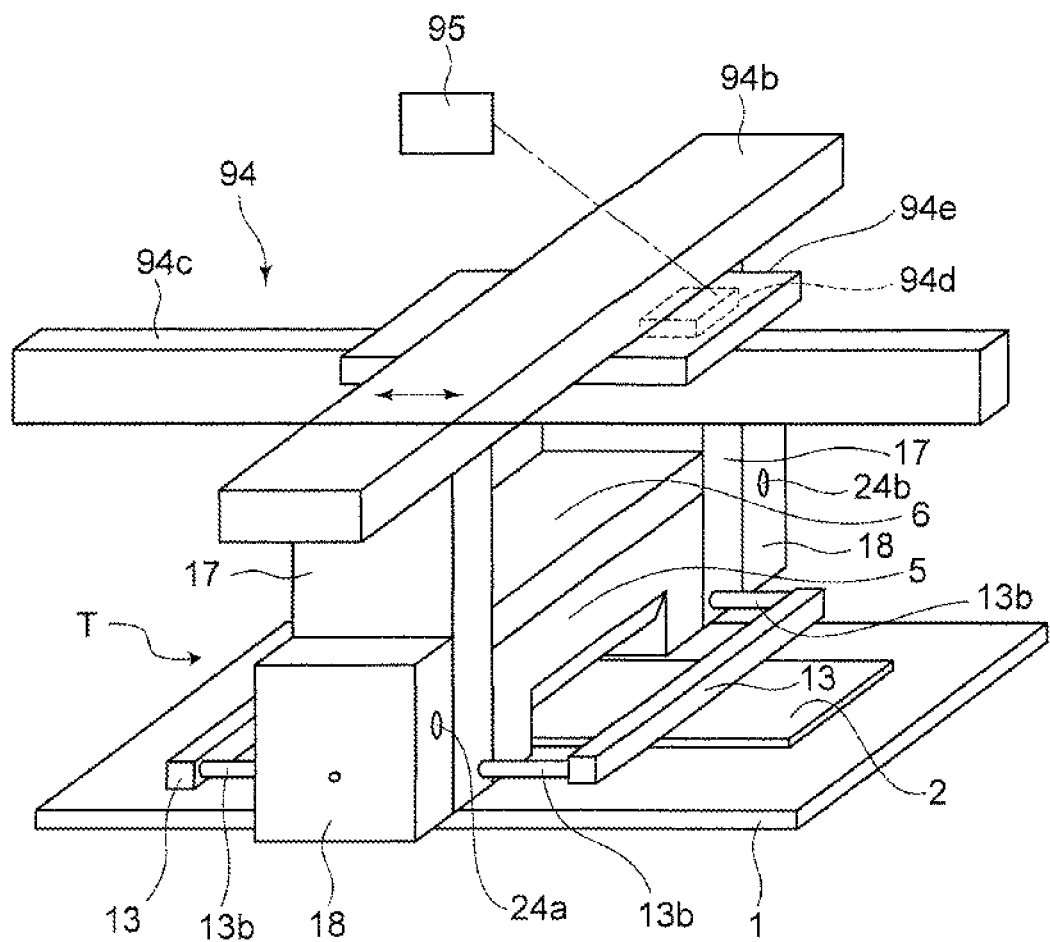
FIG. 1C is a perspective view that shows an inductive coupling-type plasma torch unit and a moving device thereof in one example of the plasma doping apparatus in accordance with the first embodiment of the present invention.
Figure 1D:
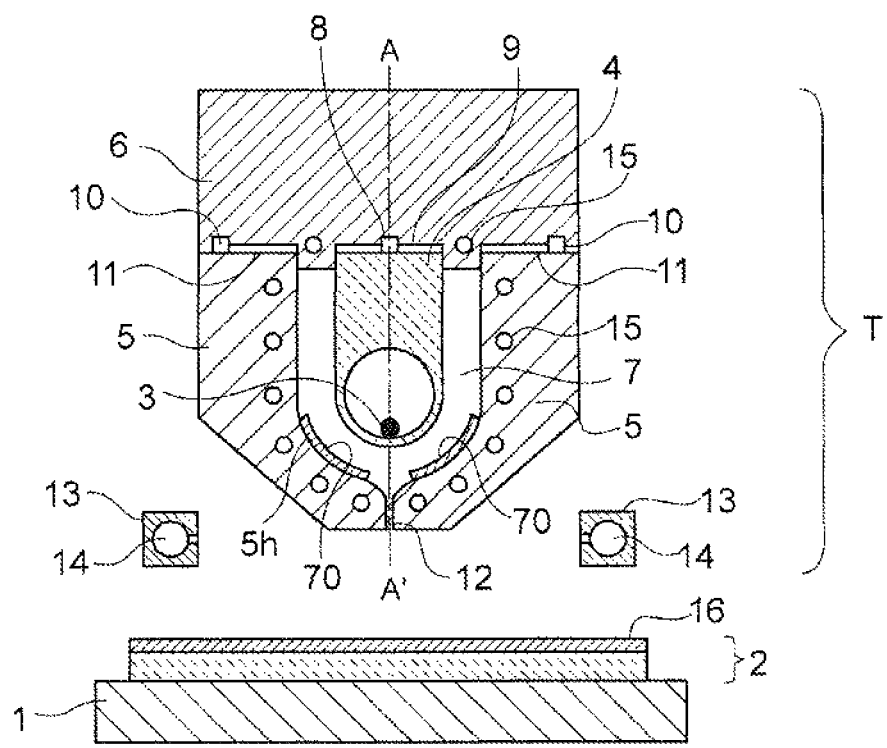
FIG. 1D is a longitudinal cross-sectional side view that shows a structure of a plasma doping apparatus in accordance with a modified example of the first embodiment of the present invention.

Alternatively, in the case when a conductive material is used as a substance containing an element to be desirably doped, this material may be preliminarily coated on an inner surface (a portion configuring the wall surface of the cylindrical chamber 7) 5h of the conductive brass block 5, with a thickness of, for example, 100 nm or more to form a coating layer 70 (see FIG. 1D). This is because, when the surface of the insulating quartz pipe 4 is coated with a conductive material, a high-frequency electromagnetic field, generated by the solenoid coil 3, is blocked. In this case, in an attempt to dope, for example, boron (B), aluminum (Al), phosphorus (P), or arsenic (As), metal boron (B), metal aluminum (Al), metal phosphorus (P), or metal arsenic (As) may be coated on the inner surface of the brass block 5, with a thickness of, for example, 100 nm or more.

In this manner, a conductive material containing atoms or molecules to be desirably doped is formed on the inner surface (a portion configuring the wall surface of the cylindrical chamber 7, which is one portion of a member defining a space in which a plasma is generated) of the brass block 5 by appropriately using a coating method, a vapor deposition method, a spattering method, or the like, with a thickness of, for example, 100 nm or more. Alternatively, instead of forming on the inner surface of the brass block 5, the brass block 5 itself may be made of one of these conductive materials (in this case, the name of the member is referred to not as "brass block", but as a name including the name of a material to be used).

In the first embodiment, since the inductive coupling type plasma torch T is used, the surface of the brass block 5 is not necessarily required to be conductive from the principle of plasma generation. Therefore, an insulating material containing atoms or molecules to be desirably doped may be preliminarily formed on the surface (a portion configuring the wall surface of the cylindrical chamber 7, which is one portion of a member defining a space in which a plasma is generated) of the brass block 5 by appropriately using a coating method, a vapor deposition method, a spattering method, or the like. Alternatively, instead of forming on the inner surface of the brass block 5, the brass block 5 itself may be made of one of these insulating materials (in this case, the name of the member is referred to not as "brass block", but as a name including the name of a material to be used).

The rectangular slit-shaped plasma jetting port 12 (referred to also as "opening portion") that communicates with the cylindrical chamber 7 is formed in the center of the lower end of the brass block 5, and the base material placing table 1 (or the base material 2 on the base material placing table 1) is disposed so as to face the plasma jetting port 12. In this state, high-frequency power is supplied to the conductor rod 3 configuring a solenoid coil from the high-frequency power supply 91, with a gas being jetted from the plasma jetting port 12 toward the base material 2 and a gas being supplied into the cylindrical chamber 7, so that a high-frequency electromagnetic field is generated in the chamber 7; thus, a plasma is generated inside the chamber 7 and the plasma is applied onto the base material 2 from the plasma jetting port 12 so that a thin film 16 on the base material 2 can be plasma-doped with desired atoms or molecules.

This structure is characterized in that all the longitudinal direction of the cylindrical chamber 7, the extending direction of the coil 3, and the longitudinal direction of the opening portion 12 are made in parallel with one another, and by relatively moving the chamber 7 and the base material placing table 1 in a direction perpendicular to the longitudinal direction of the opening portion 12 by the moving device 94 (preferably, in a direction that is perpendicular to the longitudinal direction of the opening portion 12 and is substantially in parallel with the installation surface of the plasma apparatus), the base material 2 is processed. That is, in the lateral direction of FIG. 1A, that is, in the direction perpendicular to the sheet surface of FIG. 1B, the inductive coupling type plasma torch unit T or the base material placing table 1 is moved.

FIG. 1C shows one example of the moving device 94 that moves the plasma torch unit T at a constant speed with respect to the base material 2 on the base material placing table 1 fixedly disposed. In FIG. 1C, the moving device 94 is configured by a bracket 94b to which the upper ends of the brass block 17 at the two ends of the plasma torch unit T are secured, a rail 94c that extends in the moving direction (a direction perpendicular to the longitudinal direction of the plasma torch unit T or the brass block 5) of the moving device 94, and a moving stage 94e on which the bracket 94b is secured, and which allows the bracket 94b to move at a constant speed along the rail 94c to which a screw shaft engaged with a movement-driving motor 94d is secured, by a forwardly/reversely rotating the motor 94d provided as one example of a movement-driving device. Therefore, under the control of the control device 95, the movement-driving motor 94d is forwardly rotated so that the moving stage 94e proceeds or retreats along the rail 94c at a constant speed and the plasma torch unit T can be moved via the bracket 94b with respect to the base material 2.

In this manner, under the control of the control device 95, a plasma torch unit T3 is allowed to carry out plasma processing, with the plasma torch unit T3 being moved on the base material 2 at a constant speed by the moving device 94.

Upon allowing the moving device 94 to move the plasma torch unit T3 on the base material 2, its moving direction may be one direction, or reciprocal moving operations may be carried out.

This moving device 94 may be applied to another embodiment or a modified example, which will be described later.

The control device 95 respectively controls the operations of the gas supply device (the gas supply device configured by the plasma gas supply device 90, the shield gas supply device 92, and the sheath gas supply device 97), the shield gas supply device 92, the high-frequency power supply 91, the moving device 94, the coolant supply device 98, and the like, so that desired plasma processing can be carried out.

Atoms or molecules to be desirably doped are generated from a solid substance configuring the outer surface 4h of the quartz pipe 4 or the inner wall of the cylindrical chamber 7 by sublimation thereof caused by the heat of the plasma. Alternatively, a gas containing hydrogen is supplied into the cylindrical chamber 7 so that hydrogen radicals as activator species obtained by ionizing the hydrogen gas are allowed to react with the outer surface 4h of the quartz pipe 4 or the inner wall of the cylindrical chamber 7, and desired atoms or molecules can be generated from a solid substance configuring the outer surface 4h of the quartz pipe 4 or the inner wall of the cylindrical chamber 7 by chemical etching. In particular, in an attempt to dope boron (B), phosphorus (P), or arsenic (As), since hydrogenated boron ($B_xH_y$), hydrogenated phosphorus ($P_xH_y$), or hydrogenated arsenic ($As_xH_y$) is generated from a solid substance configuring the outer surface 4h of the quartz pipe 4 or the inner wall of the cylindrical chamber 7 into the cylindrical chamber 7 by chemical etching, so that boron, phosphorus, arsenic, or the like, that is a decomposition product thereof can be doped.

In this manner, by irradiating the base material whose surface is a semiconductor with a plasma, the semiconductor of the base material 2 can be doped with atoms or molecules.

Although various kinds of gases may be applicable as a plasma gas to be supplied into the cylindrical chamber 7, an inert gas is mainly used desirably from the viewpoints of plasma stability, igniting characteristics, the service life of a member to be exposed to a plasma, and the like. Among such inert gases, an Ar gas is typically used. In the case when only the Ar gas is used to generate a plasma, the plasma has a considerably high temperature (10,000 K or more), and the semiconductor thin film 16 on the surface of the base material 2 is doped with desired atoms or molecules, and at the same time, the semiconductor thin film 16 can be heated to an activatable temperature so as to be activated. By using this method, a significant effect that no activating process is required separately from the doping process can be obtained.

Moreover, in the case when $H_2$ is added, in addition to the chemical etching function as described earlier, since a temperature rise of a plasma is achieved and since the semiconductor is heated to an activatable temperature of, for example, 600° C. or more, by the supplied high-frequency power, the thermal diffusion length can be effectively reduced by increasing the temperature of the activation to be carried out simultaneously with the doping, or by increasing the scanning speed. When the thermal diffusion length becomes smaller, the distance by which doped atoms or molecules are diffused by the activation is made shorter so that shallower pn-junctions can be achieved. Moreover, by adding $H_2$, more boron or phosphorus is allowed to come out so that a high dose can be obtained. In contrast, when He is used, the temperature of a plasma becomes lower so that a comparatively weak activated state can be realized. Alternatively, a doping process with no activation can be realized.

In the case of a Si substrate as one example of the base material, a high temperature of 800° C. or more is required upon activation thereof. Therefore, in order to achieve 800° C. or more by using only the plasma irradiation, it is required (1) to carry out the process under the conditions that allow the plasma to have a considerably high temperature, (2) to make the scanning speed slower, or (3) to make the distance from the plasma jetting port to the base material shorter. In the case of (1), the resulting side effect is that the device is rapidly consumed, in the case of (2), the processing capability (throughput) deteriorates, and in the case of (3), a margin relative to the distance between the plasma jetting port and the base material is narrowed (with the result that a predetermined distance needs to be determined more precisely). In order to reduce these side effects, a method for preliminarily heating the base material 2 to a predetermined temperature is effectively used. In the case when the predetermined temperature is 600° C. or less, crystallization and activation of Si hardly occur, so that the plasma processing is preferably carried out after the base material 2 has been preliminarily heated to about 400 to 550° C., for example, as the predetermined temperature. In order to achieve this arrangement, for example, with a heater 86 being disposed in the base material placing table 1, the base material 2 may be heated by the heater 86 under the control of a heater control unit 85 by the control device 95, or with a heat source (not shown), such as a lamp, being disposed below the base material placing table 1, the base material 2 may be heated by irradiating the base material placing table 1 with the heat source from below under the control of the heater control unit 85 by the control device 95. Alternatively, after the base material 2 has been preliminarily heated by another preliminary heating device, the base material 2 is placed on the base material placing table 1 before the base material 2 has been cooled off, and may be subjected to the plasma processing.

The following description will show the structure of a gas supply system. The plasma gas supply pipe 41 and the sheath gas supply pipe 42 are formed at the lid 6, and are respectively allowed to communicate with the plasma gas manifold 8 and the sheath gas manifold 10 via through holes inside the lid 6. As shown in FIG. 3, grooves to serve as the manifolds 8 and 10 or the gas supply holes 9 and 11 are formed on in lower surface of the lid 6. The grooves to serve as the manifolds 6 and 10 are deep, and are engraved long in parallel with the longitudinal direction of the cylindrical chamber 7 so as to function as gas reservoirs. The grooves to serve as the gas supply holes 9 and 11 are shallow, and are engraved short in parallel with the longitudinal direction of the cylindrical chamber 7, the number of which grooves is large. In this structure, a plasma gas is exuded downward, that is, in a direction from the inside of the cylindrical chamber 7 of the torch unit T toward the base material 2 through a slight gap between the convex portion of the lid 6 and the quartz pipe 4.

In the same manner, through a slight gap between the convex portion of the lid 6 and the brass block 5, a sheath gas is exuded downward, that is, in a direction from the inside of the cylindrical chamber 7 of the torch unit T toward the base material 2. Supposing that portions through which the plasma gas and the sheath gas are exuded into the cylindrical chamber 7 are respectively referred to as "gas introducing ports", the gas introducing ports are provided in parallel with the longitudinal direction of the opening portion 12, and are provided in a surface opposed to the opening portion 12. With this structure, a gas flow inside the cylindrical chamber 7 and a gas flow directed to the base material placing table 1 from the opening portion, that is, the gas jetting port 12, are smooth and easily formed into laminar flows so that stable plasma processing can be carried out.

In contrast, the shield gas is jetted from a large number of the holes 13a that communicate with the shield gas manifold 14 or a single groove, toward a gap between the opening portion 12 and the base material 2. At this time, by devising the direction of each of the holes or the single groove, the direction of the gas jet can be selectively directed to the opening portion 12 or to the surface of the base material 2. Such selection can be made appropriately depending on the kinds of the processes.

Moreover, in this structure, since the length in the longitudinal direction of the plasma jetting port 12 is equal to or made wider than the width of the base material 2, the entire thin film 16 near the surface of the base material 2 can be processed by a scanning process at one time (by relatively moving the torch unit T and the base material placing table 1).

In this plasma doping apparatus, while supplying an Ar or $Ar+H_2$ gas into the cylindrical chamber 7 from the gas introducing port as a plasma gas and a sheath gas, with an $N_2$ gas being supplied from the shield gas introducing port 13a as a shield gas, a high-frequency power of 13.56 MHz is supplied to the conductor rod 3 serving as a solenoid coil from the high-frequency power supply 91 with the plasma gas and the sheath gas being jetted from the plasma jetting port 12 toward the base material 2; thus, a plasma is generated in the cylindrical chamber 7 and atoms or molecules to be desirably doped into the base material 2 are generated from a solid substance configuring the outer surface 4h of the quartz pipe 4 or the inner wall of the cylindrical chamber 7 by sublimation thereof caused by the heat of the plasma or by chemical etching caused by activator species in the plasma. Moreover, by irradiating and scanning the base material 2 with the plasma from the plasma jetting port 12, desired atoms or molecules can be doped into the semiconductor thin film 16 of the base material 2 without the necessity of using a hazardous doping material gas. Simultaneously, by generating a plasma, for example, by using only Ar, the semiconductor is heated to an activatable temperature so that the semiconductor can be activated. Thus, a pn-junction can be realized by using a simple structure in a semiconductor device, a solar battery, a liquid crystal panel, or the like.

In the inductive coupling type plasma torch used in the first embodiment, since the cylindrical chamber 7 and the base material placing table 1 are relatively moved by the moving device 94 in a direction perpendicular to the longitudinal direction of the plasma jetting port 12, with the direction of the center axis of the solenoid coil 3, the longitudinal direction of the plasma jetting port 12, and the base material placing table 1 being disposed in parallel with one another, the length of a plasma to be generated and the processing length of the base material 2 can be made substantially equal to each other. In this case, the width of the cross section of the cylindrical chamber 7 taken along a plane perpendicular to its center axis (the width of the inner space of the chamber 7 in FIG. 1B) is desirably set to be larger even by a slight degree than the width of the plasma jetting port 12 (the length of the gap in FIG. 1B). That is, the volume of the plasma to be generated can be made extremely small. As a result, this system can provide a superior power efficiency.

Moreover, in the inner space of the cylindrical chamber 7, since a relatively uniform plasma in the direction of the center axis can be generated, the plasma is made uniform in the longitudinal direction so that the base material 2 can be processed uniformly.

The following will describe examples of numeric values regarding the doping process.

First, the length (in the longitudinal direction) of the plasma jetting port 12 is set to 130 to 1200 mm. This is because in order to process a width of 126 mm corresponding to one sheet of a crystal Si-type solar battery substrate that is mainly used currently, at least a length of 130 mm is required. On the other hand, in order to process a width of 1100 mm corresponding to one sheet of a thin-film Si-type solar battery substrate, a maximum length of 1200 mm is sufficient. The distance from the plasma jetting port 12 to the base material 2 is set to 3 to 50 mm. The scanning speed of the inductive coupling type torch unit T is set to 50 to 3000 mm/s. The total flow rate of a plasma gas for use in generating a plasma is set to 1 to 100 SLM, and the $H_2$ concentration is set to 0.01 to 10%. The total flow rate of $N_2$ as one example of a shield gas is set to 1 to 100 SLM. The high-frequency power (13.56 MHz) is set to 0.5 to 10 kW. It is noted that the gas flow rate and power are exemplary numeric values taken per 100 mm of the length of the jetting port. These parameters are appropriately used by applying corresponding amounts that are proportional to the length.

Second Embodiment

Referring to FIGS. 4A to 6, the following description will refer to a second embodiment of the present invention.

Figure 4A:
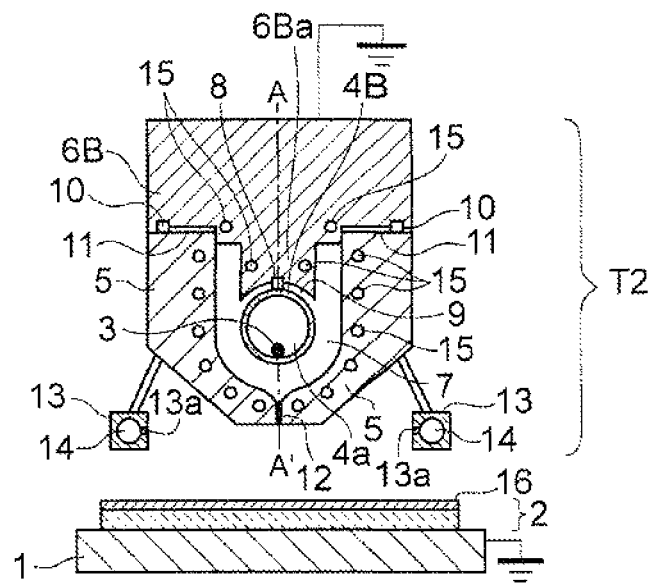
FIG. 4A is a longitudinal cross-sectional side view that shows a structure of a plasma doping apparatus in accordance with a second embodiment of the present invention.
Figure 4B:
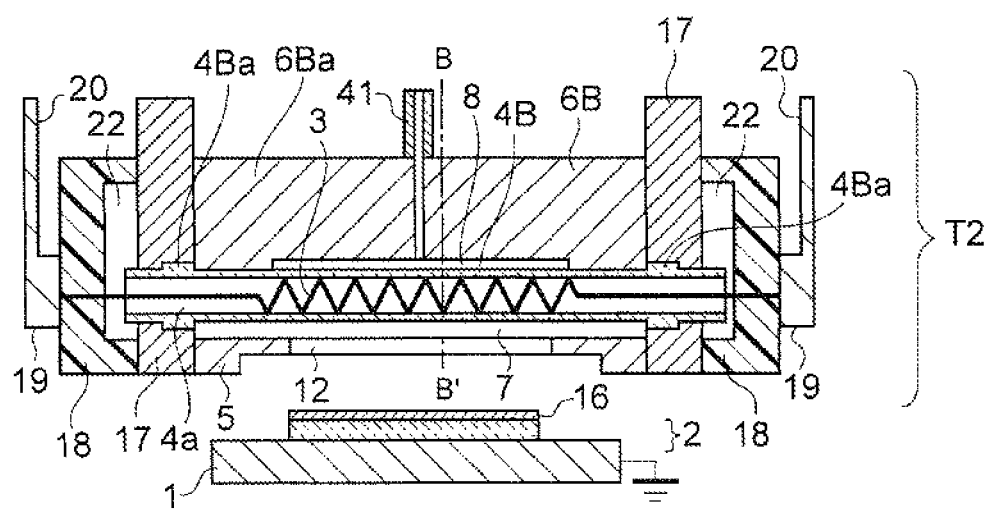
FIG. 4B is a longitudinal cross-sectional front view that shows the structure of the plasma doping apparatus in accordance with the second embodiment of the present invention.
Figure 6:
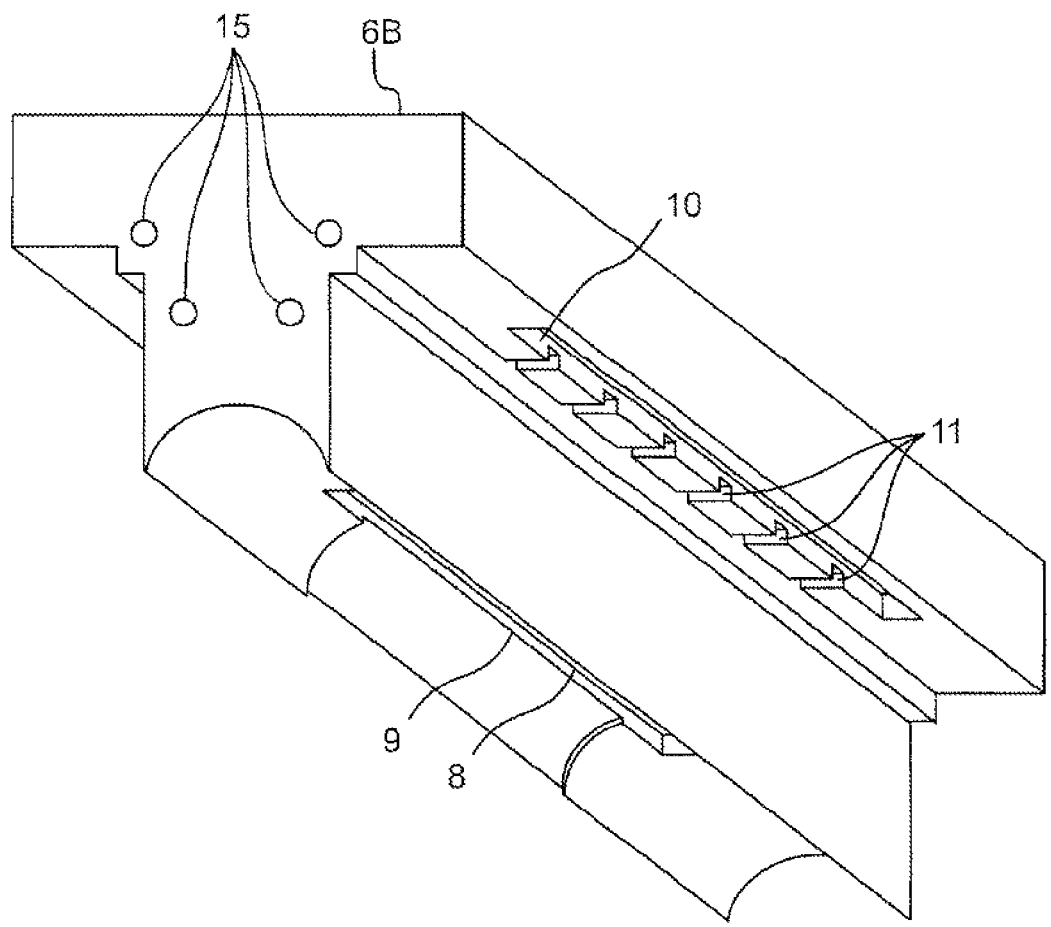
FIG. 6 is a perspective view that shows the structure of the plasma doping apparatus in accordance with the second embodiment of the present invention.

FIG. 4A, which shows a structure of a plasma doping apparatus in the second embodiment of the present invention, is a cross-sectional view taken along a plane perpendicular to the longitudinal direction of an inductive coupling type plasma torch unit T2. FIG. 4B is a cross-sectional view taken along a broken line A-A' of FIG. 4A, and the cross-sectional view is taken along a plane that includes that includes the center axis of the solenoid coil 3 and is perpendicular to the surface of the base material 2. It is noted that FIG. 4A is a cross-sectional view taken along a broken line B-B' of FIG. 4B. FIG. 5 is an assembly structural view of the inductive coupling type plasma torch unit T2 shown in FIGS. 4A and 4B, in which perspective views of respective parts are aligned. Moreover, FIG. 6 is a perspective view that shows a lid 6B configuring the inductive coupling type plasma torch unit T2, viewed from below.

Since the second embodiment is different from the first embodiment only in the shapes of a quartz pipe 4B and the lid 6B, the description of the remaining parts will not be repeated.

The quartz pipe 4B has a cylindrical shape with a uniform outer diameter except for a protruding portion (a portion having a partially larger outer diameter) 4Ba for use in positioning and sealing the large through hole 17b of the brass block 17, and this structure is superior to the first embodiment of the present invention in that the structure is very easily manufactured. More specifically, the protruding portion 4Ba of the quartz pipe 4B is tightly made in contact with and fitted into the large through hole 17b of the brass block 17 moreover, in an attempt to form laminar gas flows by filling a space above the quartz pipe 4B, the lower portion of a center portion 6Ba at the lower end of the lid 6B is greatly curved downward to form a convex portion. Moreover, the tip (lower end surface) of this convex portion 6Ba is curved into an arc shape so as to extend along the outer surface of the quartz pipe 4B. Since cooling water pipes 15 can be formed also at the convex portion 6Ba, a more effective water cooling operation than that of the first embodiment can be obtained.

The plasma gas supply pipe 41 and the sheath gas supply pipe 42 are provided in the lid 6B so that these pipes are respectively allowed to communicate with the plasma gas manifold 8 and the sheath gas manifold 10 via through holes in the lid 6B, respectively. As shown in FIG. 6, grooves configuring the manifolds 8 and 10 as well as the gas supply holes 9 and 11 are respectively formed in the lower surface of the lid 6B. The grooves configuring as the manifolds 8 and 10 are deep, and are engraved long in parallel with the longitudinal direction of the cylindrical chamber 7 so as to function as gas reservoirs. The groove configuring the gas supply hole 9 is shallow, and is engraved long in parallel with the longitudinal direction of the cylindrical chamber 7, and the number of the groove is only one. The grooves configuring the gas supply holes 11 are shallow, and are engraved short in parallel with the longitudinal direction of the cylindrical chamber 7, and the number of these grooves is large. The feature that the groove configuring the gas supply hole 9 is engraved long in the longitudinal direction makes the second embodiment greatly different from the first embodiment. Even in the structure of the second embodiment, a large number of shallow grooves engraved short in the longitudinal direction may be used, or in contrast, even in the structure of the first embodiment, a single shallow groove engraved long in the longitudinal direction may be used.

In this structure, a plasma gas is exuded downward, that is, in a direction from the torch unit T2 toward the base material 2, through a slight gap (shallow groove) between the convex portion 6Ba of the lid 6B and the quartz pipe 4B. In the same manner, a plasma gas is exuded downward, that is, in a direction from the torch unit T toward the base material 2, through a slight gap between the convex portion 6Ba of the lid 6B and the brass block 5.

Third Embodiment

Referring to FIGS. 7A to 12, the following description will refer to a third embodiment of the present invention.

Figure 7A:
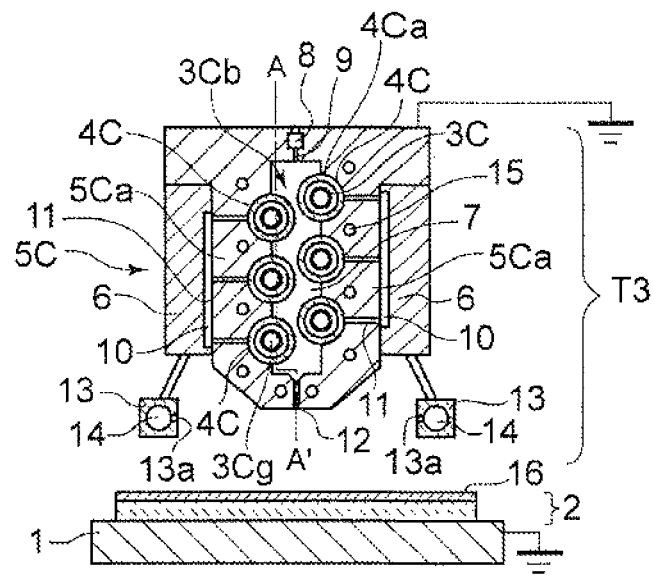
FIG. 7A is a longitudinal cross-sectional side view that shows a structure of a plasma doping apparatus in accordance with a third embodiment of the present invention.
Figure 7B:
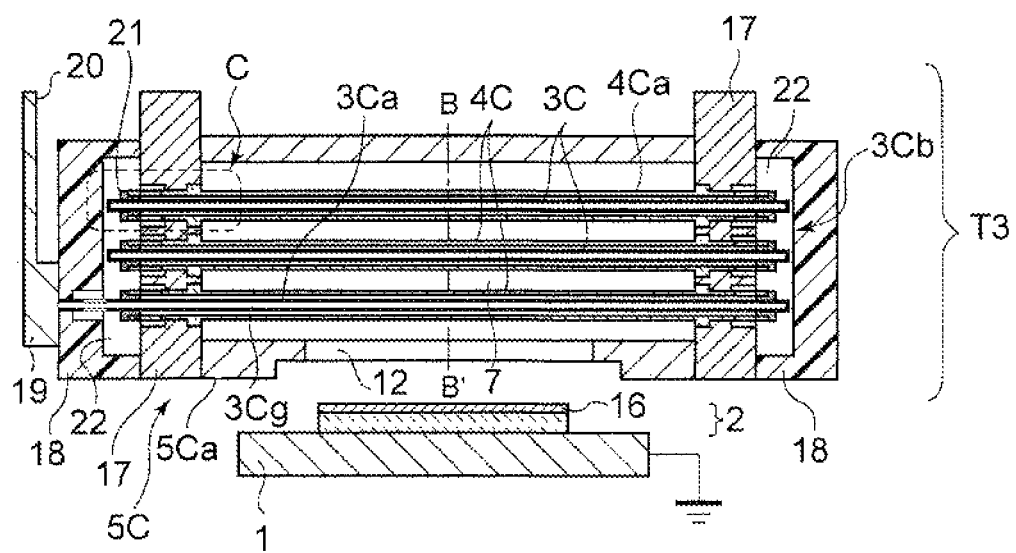
FIG. 7B is a longitudinal cross-sectional front view that shows the structure of the plasma doping apparatus in accordance with the third embodiment of the present invention.
Figure 8:
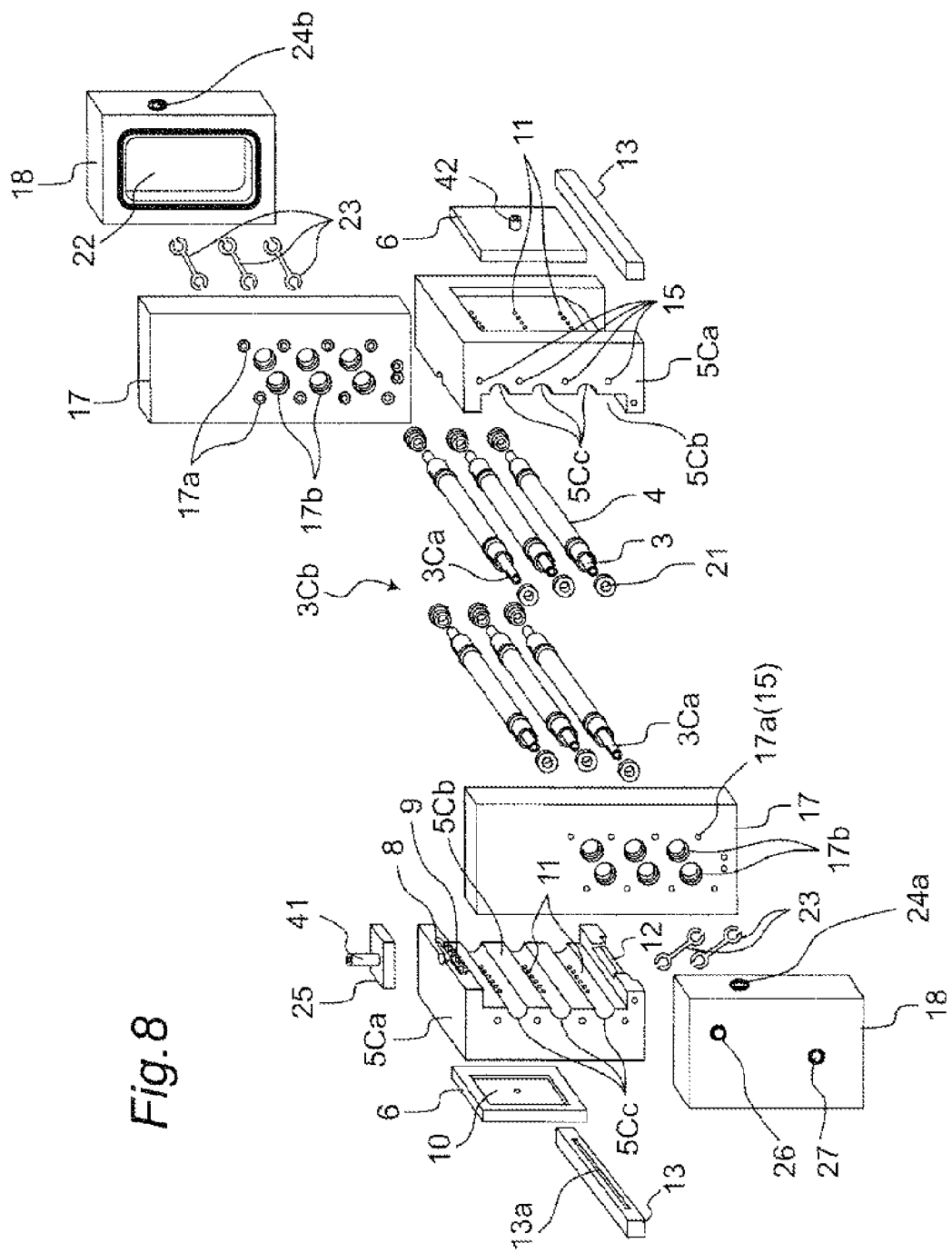
Figure 9:
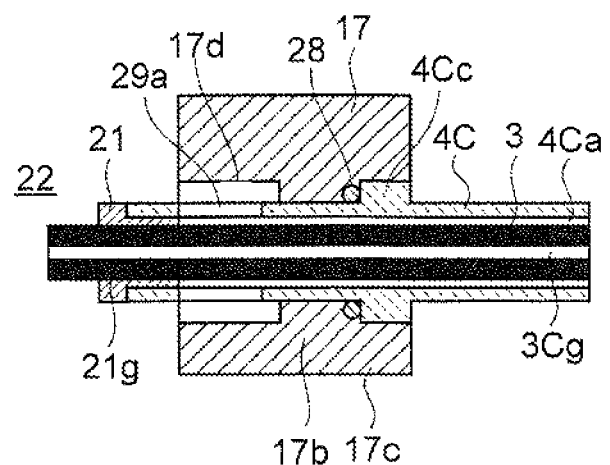
FIG. 9 is a cross-sectional view that shows the structure of the plasma doping apparatus in accordance with the third embodiment of the present invention.
Figure 10:
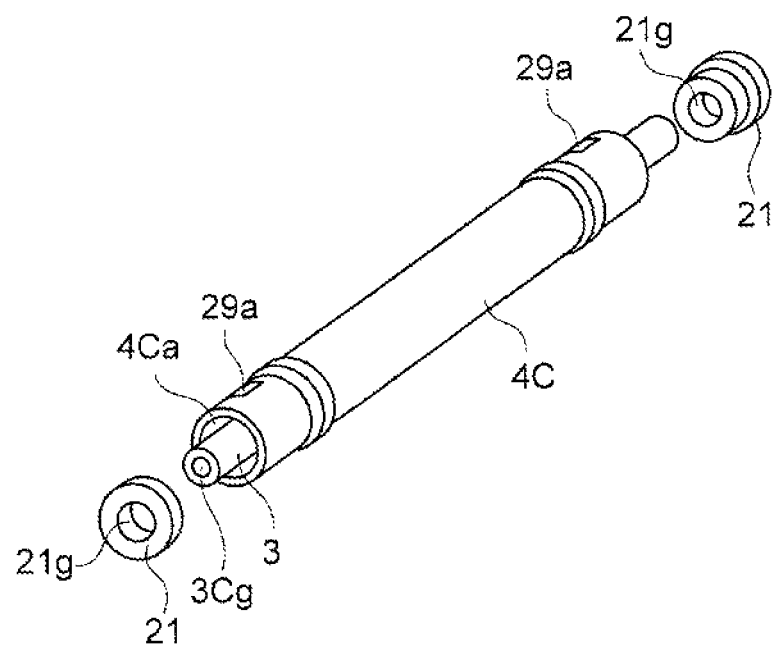
FIG. 10 is a perspective view that shows the structure of the plasma doping apparatus in accordance with the third embodiment of the present invention.
Figure 11:
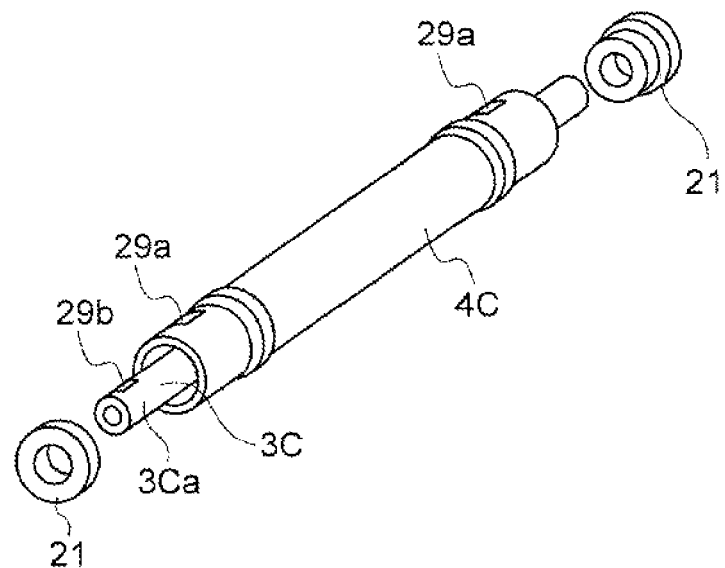
FIG. 11 is a perspective view that shows the structure of the plasma doping apparatus in accordance with the third embodiment of the present invention.
Figure 12:
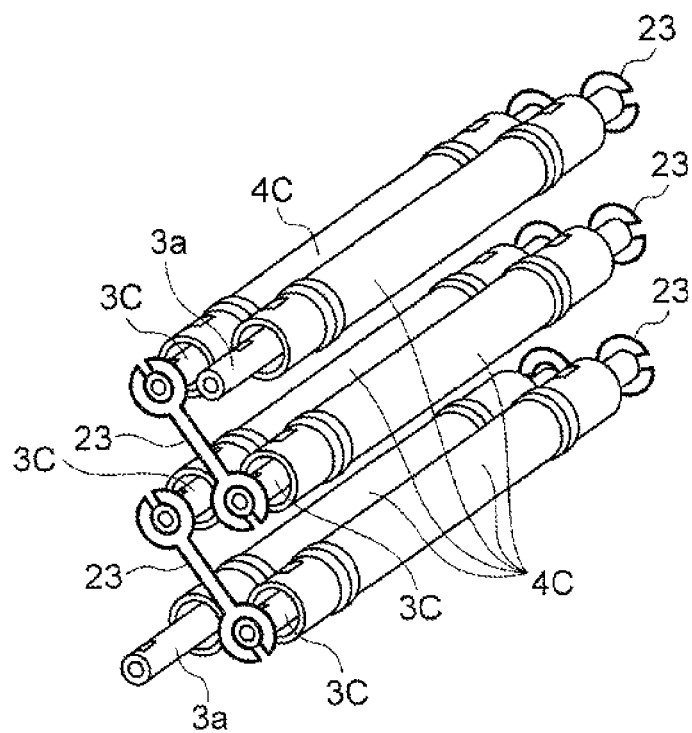
FIG. 12 is a perspective view that shows the structure of the plasma doping apparatus in accordance with the third embodiment of the present invention.

FIG. 7A, which shows a structure of a plasma doping apparatus in the third embodiment of the present invention, is a cross-sectional view taken along a plane perpendicular to the longitudinal direction of an inductive coupling type plasma torch unit T3. FIG. 7B is a cross-sectional view taken along a broken line A-A' of FIG. 7A, and the cross-sectional view is taken along a plane that includes the center axis of a conductor rod 3C and is perpendicular to the surface of the base material 2. It is noted that FIG. 7A is a cross-sectional view taken along a broken line B-B' of FIG. 7B. FIG. 8 is an assembly structural view of the inductive coupling type plasma torch unit T3 shown in FIGS. 7A and 7B in which perspective views of respective parts are aligned. Moreover, FIG. 9 is an expanded cross-sectional view showing a C portion of FIG. 7B. FIG. 10 is a perspective view that shows a peripheral structure of the conductor rod 3C, FIG. 11 is a perspective view that shows a peripheral structure of the long conductor rod 3C, and FIG. 12 is a perspective view that shows layouts of the conductor rods 3C and conductor links 23.

In FIGS. 7A to 8, the base material 2 is placed on a base material placing table 1. In the inductive coupling type plasma torch unit T3, a coil 3Cb has a structure in which a plurality of conductor rods 3C disposed in parallel with the longitudinal direction of the cylindrical chamber 7 are connected with one another by conductor links 23 (conductive couplers or connectors) that are disposed perpendicularly to the longitudinal direction of the cylindrical chamber 7, and this structure forms a spiral shape as a whole, with an inner space of the spiral structure and an inner space of the cylindrical chamber 7 being overlapped with each other. For example, as shown in FIG. 7A, one end (right end in FIG. 7B) of the conductor rod 3C at the upper end on the right side is electrically connected to one end (right end of FIG. 7B) of the conductor rod 3C at the upper end on the left side by the conductor link 23, with the other end (left end of FIG. 7B) of the conductor rod 3C at the upper end on the left side being electrically connected to the other end (left end of FIG. 7B) of the conductor rod 3C in the middle on the right side by the conductor link 23, one end (right end in FIG. 7B) of the conductor rod 3C in the middle on the right side being electrically connected to one end (right end of FIG. 7B) of the conductor rod 3C at the lower end on the left side by the conductor link 23, and the other end (left end of FIG. 7B) of the conductor rod 3C at the lower end on the left side being electrically connected to the other end (left end of FIG. 7B) of the conductor rod 3C at the lower end on the right side by the conductor link 23, so that the other end (right end of FIG. 7B) of the conductor rod 3c at the lower end on the right side and the other end (right end of FIG. 7B) of the conductor rod 3C at the upper end on the left side are allowed to configure two ends of the coil 3Cb so as to be electrically connected to the high-frequency power supply 91 through the high-frequency matching circuit 93; thus, a high-frequency power is applied to the coil 3Cb. In this case, the conductor rods 3C and the conductor links 23 (conductive couplers or connectors) configure the coil 3Cb. The plurality of conductor rods 3C are respectively disposed in through holes 4Ca inside the quartz pipe 4C as one example of a dielectric cylinder in a manner so as to penetrate the quartz pipe 4C. On the periphery of the quartz pipe 4C, a casing that configures the wall surface of the cylindrical chamber 7 or a brass block 5C as one example of an apparatus main body block is disposed, and the outside of the quartz pipe 4C is made in contact with the brass block 5C. In other words, the brass block 5C is formed into a T-letter shape in longitudinal cross section, with two divided blocks 5Ca each having a J-letter shape in longitudinal cross section, being fitted to each other, and a concave portion 5Cb which is located in the center in the width direction perpendicular to the longitudinal direction of the brass block 5C, extends over the entire length in the longitudinal direction thereof, and is recessed upward from the lower end opening, is formed therein. Inside this concave portion 5Cb, three quartz pipes 4C are secured respectively into curved concave portions 5Cc (dielectric cylinder fitting concave portions) on the two opposite surfaces of the concave portion 5Cb, with outer half portions of the quartz pipes 4C being embedded therein. In this case, the three quartz pipes 4C on each of the right and left sides of FIG. 7A are not fixed at the same height, but are disposed at different positions by about a length corresponding to the radius with, for example, the three quartz pipes 4C on the right side being disposed at a higher position than that of the three quartz pipes 4C on the left side, so that the six quartz pipes 4C are disposed alternately. Therefore, the space inside the cylindrical chamber 7 configures a cylindrical elongated space surrounded by the quartz pipes 4C, the brass block 5C, and the brass blocks 17 that are disposed at the two ends in the longitudinal direction of the brass block 5C. In other words, one portion of each of the quartz pipes 4C (inner half column portion) is exposed to the space inside the cylindrical chamber 7 so as to form one portion of a wall surface thereof.

Above the concave portion 5Cb of each of the divided blocks 5Ca configuring the brass block 5C, a groove configuring the plasma gas manifold 8 is formed, and a groove configuring a plasma gas supply hole 9 as one example of the gas introducing port that allows the plasma gas manifold 8 and the concave portion 5Cb, that is, the chamber 7 to communicate with each other is formed. Thus, in this structure, when the two divided blocks 5Ca are combined with each other to form the brass block 5C, these grooves are respectively jointed to each other to form closed spaces so that the plasma gas manifold 8 and the plasma gas supply hole 9 are respectively defined. Moreover, rectangular-plate-shaped lids 6 are respectively disposed on the outside of the brass block 5C in the width direction perpendicular to the longitudinal direction of the brass block 5C. A counter bore to be formed into the sheath gas manifold 10 is formed on the inner surface on the brass block 5C side of each of the lids 6, and in this structure, when combined with the brass block 5C, each of spaces surrounded by the brass block 5C and the lid 6 forms a closed space so as to define the sheath gas manifold 10. Moreover, in the brass block 5C, through holes each of which configures the sheath gas supply hole 11 that extends from the corresponding sheath gas manifold 10 in the width direction of the brass block 5C to reach the outer surface of each quartz pipe 4C are formed. The sheath gas supply device 97 is connected respectively to the sheath gas manifolds 10 so that a sheath gas (dielectric cylinder protective gas) can be supplied from the sheath gas supply device 97 controlled by the control device 95 to the sheath gas manifolds 10. The sheath gas supplied to the sheath gas manifold 10 is allowed to reach the outer surface of each of the quartz pipes 4C from the sheath gas supply hole 11 and directed around the outer surface of each of the quartz pipes 4C through a gap between the curved concave portion 5Cc and the quartz pipe 4C so that the sheath gas is introduced into the chamber 7.

Furthermore, a pair of shield gas nozzles 13, each as one example of a shield gas supply member, are disposed at a portion close to the base material placing table 1 below the lids 6 (in other words, between the lid 6 and the base material placing table 1), with the plasma jetting port 8 being interposed therebetween. The paired shield gas nozzles 13 are supported, for example, on the brass block 5C and secured thereto by support arms (see the support arms 13b in the first embodiment). In the surface of each of the shield gas nozzles 13 on the plasma gas jetting port 8 side, a large number of shield gas introducing ports 13a disposed in the longitudinal direction are opened, and in each of the shield gas nozzles 13, shield gas manifolds 14, each used for connecting the shield gas supply device 92 to the large number of nozzles, are installed. In this manner, three types of gas introducing systems for the plasma gas, sheath gas, and shield gas are prepared so that by appropriately adjusting the gas types, gas flow rates, or the like in a divided manner into the plasma gas suitable for generating a plasma and the sheath gas for protecting the outer wall surface of the quartz pipes 4C, it is possible to carry out a stable plasma processing operation and, by supplying the shield gas in a separated manner, it is also possible to reduce mixing of gases such as oxygen, carbon dioxide, or the like in the air, which are unnecessary for the processing or cause adverse effects thereto, into the plasma irradiation surface.

The inside of the through hole 4Ca in the quartz pipe 4C in which the conductor rod 3C is disposed is connected to the coolant supply device 98 and immersed in water as one example of an insulating fluid, and water as one example of a coolant is allowed to flow therethrough so that the quartz pipe 4C and the conductor rod 3C are cooled in this structure.

Moreover, the conductor rod 3C is prepared as a hollow pipe, and water as one example of the insulating fluid supplied from the coolant supply device 98 is allowed to flow in a through hole 3Cg inside the conductor rod 3C so that the conductor rod 3C is cooled in this structure. That is, by allowing the insulating fluid as one example of a coolant to flow through a space between the outer wall surface of the conductor rod 3C and the inner wall surface of the quartz pipe 4C, the conductor rod 3C and the quartz pipe 4C are cooled, and the conductor rod 3C is prepared as a hollow pipe, and by allowing the insulating fluid as one example of a coolant to flow into the inner space of the pipe configured by the conductor rod 3C, the conductor rod 3C is cooled in this structure.

Moreover, in the brass block 5C, cooling water pipes 15 serving as coolant channels penetrating the block 5C are formed near the concave portion 5Cb and connected to the coolant supply device 98. More specifically, these water passages (coolant channels) are allowed to communicate with the coolant supply device 98 through the cooling water manifold 22 configured by a space between the resin case 18 placed outside the brass block 17 and the brass block 17. Each of cooling water inlet/outlet ports 24a and 24b serving as a coolant introducing port and a coolant jetting port that are respectively connected to the coolant supply device 98 is formed at one position of the resin cases 18 so that the distribution of the water cooling pipes to the inductive coupling type torch unit T3 is highly simplified; thus, it is possible to provide a small-size torch. That is, this structure is provided with the two coolant manifolds 22 on the two sides in the longitudinal direction of the cylindrical chamber 7, and the coolant channel 15 that allows the two coolant manifolds 22 to communicate with each other is formed in each of the members that configure the cylindrical chamber 7. In this case, the space between the conductor rod 3C and the quartz pipe 4C, and the inside of the conductor rod 3C also configure coolant channels. All the coolant channels are connected to the coolant manifolds 22 in parallel with one another, and in this structure, one of the single coolant introducing port 24a and the single coolant jetting port 24b is provided on one of the two coolant manifolds 22. Moreover, the cross-sectional area of the connecting portion between the coolant manifold 22 and each coolant channel, or the cross-sectional area of the coolant channel itself is not even, and the cross-sectional area of the coolant channel formed in the brass block 5C or each of connecting portions (a large number of small through holes 17a formed in the brass block 17) is small, while the cross-sectional area of the inner diameter (the diameter of the coolant channel) of the quartz pipe 4 or each of connecting portions (six large through holes 17b formed in the brass block 17) is made larger.

With this structure, the channel cross-sectional area of the channel of the quartz pipe 4C that is a member requiring a high cooling operation is made larger so that the total flow rate of the coolant can be reduced.

Among the conductor rods 3C, two long conductor rods 3Ca corresponding to the two ends of the coil 3Cb (the conductor rod 3C at the upper end on the right side and the conductor rod 3C at the lower end on the left side in FIG. 7A) are connected to the copper blocks 19 through the high-frequency introducing terminal hole 26 and the grounding terminal hole 27 formed in the resin cases 18 so as to be connected to the high-frequency power supply 91 through the high-frequency matching circuit 93, with the copper plates 20 interpolated therebetween.

The outer surface (a portion configuring the wall surface of the cylindrical chamber 7) of the quartz pipe 4C is coated with a substance containing an element desired to be doped to the base material 2, with a thickness of, for example, 100 nm or more. For example, in an attempt to dope boron (B), boron glass ($B_2O_3$) may be coated on the outer surface of the quartz pipe 4C. Alternatively, in an attempt to dope aluminum (Al), alumina ($Al_2O_3$) may be coated on the outer surface of the quartz pipe 4C with a thickness of, for example, 100 nm or more. Further alternatively, in an attempt to dope phosphorus (P), phosphorus glass ($P_2O_5$), aluminum metaphosphate ($Al(PO_3)_3$), or $LaP_5O_{14}$ may be coated on the outer surface of the quartz pipe 4C with a thickness of, for example, 100 nm or more. In an attempt to dope arsenic (As), arsenic glass ($As_2O_5$) may be coated on the outer surface of the quartz pipe 4C with a thickness of, for example, 100 nm or more.

In this manner, an insulating material containing atoms or molecules to be desirably doped is preliminarily formed on the outer surface (a portion configuring the wall surface of the cylindrical chamber 7, which is one portion of a member defining a space in which a plasma is generated) of the quartz pipe 4C by appropriately using a coating method, a vapor deposition method, a spattering method, or the like. Alternatively, instead of forming on the outer surface of the quartz pipe 4C, the quartz pipe 4C itself may be made of one of these insulating materials (in this case, the name of the member is referred to not as "quartz pipe", but as a name including the name of a material to be used).

Still alternatively, in the case when a conductive material is used as a substance containing an element to be desirably doped, this material may be preliminarily coated on an inner surface (a portion configuring the wall surface of the cylindrical chamber 7) of the conductive brass block 5C, with a thickness of, for example, 100 nm or more. This is because, if the outer surface of the insulating quartz pipe 4C is coated with a conductive material, a high-frequency electromagnetic field generated by the coil 3Cb is blocked. In this case, in an attempt to dope, for example, boron (B), aluminum (Al), phosphorus (P), or arsenic (As), metal boron (B), metal aluminum (Al), metal phosphorus (P), or metal arsenic (As) may be coated on the inner surface of the brass block 5C, with a thickness of, for example, 100 nm or more. In this manner, a conductive material containing atoms or molecules to be desirably doped is formed on the inner surface (a portion configuring the wall surface of the cylindrical chamber 7, which is one portion of a member defining a space in which a plasma is generated) of the brass block 5C by appropriately using a coating method, a vapor deposition method, a spattering method, or the like. Alternatively, instead of forming on the inner surface of the brass block 5C, the brass block 5C itself may be made of one of these conductive materials (in this case, the name of the member is referred to not as "brass block", but as a name including the name of a material to be used).

In the third embodiment, since the inductive coupling type plasma torch is used, the surface of the brass block 5C is not necessarily required to be conductive from the principle of plasma generation. Therefore, an insulating material containing atoms or molecules to be desirably doped may be preliminarily formed on the inner surface (a portion configuring the wall surface of the cylindrical chamber 7, which is one portion of a member defining a space in which a plasma is generated) of the brass block 5C by appropriately using a coating method, a vapor deposition method, a spattering method, or the like. Alternatively, instead of forming on the inner surface of the brass block 5C, the brass block 5C itself may be made of one of these insulating materials (in this case, the name of the member is referred to not as "brass block", but as a name including the name of a material to be used).

A rectangular slit-shaped plasma jetting port 12 (referred to also as "opening portion") that communicates with the cylindrical chamber 7 is formed in the center at the lower end of the brass block 5C, and the base material placing table 1 (or the base material 2 on the base material placing table 1) is disposed so as to face the plasma jetting port 12. In this state, a high-frequency power is supplied to the conductor rod 3C configuring the coil 3Cb from the high-frequency power supply 91 through the high-frequency matching circuit 93, with a gas being jetted from the plasma jetting port 12 toward the base material 2 and the gas being supplied into the cylindrical chamber 7. Thus, a plasma is generated inside the cylindrical chamber 7, and the plasma is applied onto the base material 2 from the plasma jetting port 12 so that the thin film 16 on the base material 2 can be plasma-processed.

This structure is characterized in that all the longitudinal direction of the cylindrical chamber 7, the longitudinal direction of the conductor rod 3C, and the longitudinal direction of the opening portion 12 are made in parallel with one another, and by relatively moving the chamber 7 and the base material placing table 1 in a direction perpendicular to the longitudinal direction of the opening portion 12 by the moving device (the same moving device as that of the first embodiment) 94, the base material 2 is processed. In other words, in the lateral direction of FIG. 7A, that is, in the direction perpendicular to the sheet surface of FIG. 75, the inductive coupling type plasma torch unit T3 or the base material placing table 1 is moved.

Atoms or molecules to be desirably doped are generated from a solid substance configuring the inner surface of the cylindrical chamber 7 by sublimation thereof caused by the heat of the plasma. Alternatively, a gas containing hydrogen is supplied into the cylindrical chamber 7, and hydrogen radicals that are activator species obtained by ionizing the hydrogen gas are allowed to react with the inner wall of the cylindrical chamber 7 so that desired atoms or molecules can be generated from a solid substance configuring the inner wall of the cylindrical chamber 7 by chemical etching. In particular, in an attempt to dope boron (B), phosphorus (P), or arsenic (As), since hydrogenated boron ($B_xH_y$), hydrogenated phosphorus ($P_xH_y$), or hydrogenated arsenic ($As_xH_y$) is generated from a solid substance configuring the inner wall of the cylindrical chamber 7 by chemical etching so that boron, phosphorus, arsenic, or the like, which is a decomposition product thereof can be doped.

In this manner, by irradiating with a plasma the base material 2 whose surface is a semiconductor, the semiconductor of the base material 2 can be doped with atoms or molecules.

In the conventional art, a structure in which a solid-state target is sputtered by using a vacuum plasma has been disclosed; however, since an atmospheric pressure plasma is used in the third embodiment, the resulting advantage is that a very simple structure of the apparatus can be obtained. Moreover, in the case when the solid-state target is sputtered, since sputtered particles need to uniformly reach the surface of the base material 2, a special arrangement is required for the layouts of the target or the base material 2; however, in the third embodiment, since an impurity generated by sublimation or chemical etching is utilized, it is not difficult to make the doping concentration distribution in the longitudinal direction uniform by devising the gas flow or the like, and since the scanning process is carried out while the torch T3 and the base material 2 are being relatively moved by the moving device (the same moving device as that of the first embodiment) 94 so that the entire surface of the base material 2 is processed, the uniformity in the scanning direction is ensured from the principle point of view; therefore, it is possible to obtain a plasma doping method that can maintain the uniformity more easily in comparison with the conventional art.

Although various kinds of gases may be applicable as the plasma gas to be supplied into the cylindrical chamber 7, an inert gas is mainly used desirably from the viewpoints of plasma stability, igniting characteristics, the service life of each member to be exposed to a plasma, and the like. Among such inert gases, an Ar gas is typically used. In the case when only the Ar gas is used to generate a plasma, the plasma has a considerably high temperature (10,000 K or more), and the semiconductor thin film 16 on the surface of the base material 2 is doped with desired atoms or molecules and at the same time, the semiconductor thin film 16 can be activated. By using this method, a significant effect that no activating process is required separately from the doping process can be obtained.

Moreover, in the case when $H_2$ is added, in addition to the chemical etching function as described earlier, since the semiconductor is heated to an activatable temperature by the supplied high-frequency power to cause a temperature rise of the plasma, the temperature of the activation to be simultaneously carried out with the doping can be increased, as well as the thermal diffusion length can be effectively reduced by increasing the scanning speed. When the thermal diffusion length becomes smaller, the distance by which doped atoms or molecules are diffused by the activation is made shorter so that shallower pn-junctions can be achieved. In contrast, when He is used, the temperature of a plasma becomes lower so that a comparatively weak activated state can be realized. Alternatively, a doping process with no activation can be realized.

The following will describe the structure of a gas supply system. The plasma gas supply pipe 41 is provided on a flange 25. By combining the flange 25 with the upper end face of the brass block 5C, the plasma gas supply pipe 41 is allowed to communicate with the plasma gas manifold 8 via a through hole configured by the plasma gas supply pipe 41 and the upper end face of the brass block 5C. Moreover, the sheath gas supply pipes 42 are respectively formed at the lid 6 so that they are allowed to communicate with the sheath gas manifold 10 via the through holes inside the lids 6. A groove configuring the plasma manifold 8 is deep, and is engraved long in parallel with the longitudinal direction of the cylindrical chamber so as to function as a gas reservoir. Grooves configuring the gas supply holes 9 are shallow, and are engraved short in parallel with the longitudinal direction of the cylindrical chamber 7, and the number of the grooves is large. In this structure, a plasma gas is exuded sideward, that is, in a direction perpendicular to the direction from the torch unit T3 toward the base material 2 through a slight gap between the concave portion 5Cb of the brass block 5C and the quartz pipe 4C. Supposing that a portion through which the plasma gas is exuded into the cylindrical chamber 7 is referred to as a "gas introducing port", the gas introducing port is provided in parallel with the longitudinal direction of the opening portion 12. On the other hand, the shield gas is jetted from the large number of holes 13a that communicate with the shield gas manifold 14 or a single groove that communicates therewith, toward a gap between the opening portion 12 and the base material 2. At this time, by devising the direction of the holes or the single groove, the direction of the gas jet can be selectively directed to the opening portion 12 or the surface of the base material 2, and the selection can be appropriately made depending on the kinds of the processing. With this arrangement, it is possible to protect the outer wall surface of the quartz pipe 4C as one example of a dielectric cylinder, by using a smaller gas flow rate.

The following description will refer to the way how to allow the cooling water to flow. In FIG. 9, the brass block 17 has such a function as to carry out the positioning of the quartz pipes 4C, and through holes 17b are formed depending on the number of the quartz pipes 4C. At each of the through holes 17b, counter bores 17c and 17d are formed from the two sides thereof, and an O-ring 2B for use in preventing water leakage is provided to the inner counter bore 17c and a portion 4Cc with a wider outer diameter of the quartz pipe 4C is fitted thereinto. As shown in FIGS. 9 to 10, a through hole 29a having a rectangular shape is provided near the tip of each of the two ends of the quartz pipe 4C so that, when fitted into the brass block 17, the through hole 29a is disposed into the outer counter bore 17d. The two ends of the quartz pipe 4C are closed by bushes 21 used for making the center axes of the conductor rod 3C and the quartz pipe 4C coincident with each other.

Therefore, in this structure, cooling water is allowed to pass through the outer counter bore 17d of one of the brass blocks 17 and the through hole 29a from one of the cooling water manifolds 22 and to flow into the through hole 4Ca inside the quartz pipe 4C from one of the end sides, and is further allowed to pass through the through hole 29a and the outer counter bore 17d of the other brass block 17 on the other end side of the through hole 4Ca, and to flow out toward the other cooling water manifold 22. In the center of each of the bushes 21, a through hole 21g is provided so as to allow the conductor rod 3C to penetrate and protrude therefrom so that cooling water is allowed to flow into one end of the through hole 3Cg inside the conductor rod 3C from one of the cooling water manifolds 22 and to flow out toward the other one of the cooling water manifolds 22 from the other end of the through hole 3Cg. In this case, ends of the elongated conductor rod 3Ca have such a structure as to pass through the high-frequency introducing terminal hole 26 and the grounding terminal hole 27 formed in the resin cases 18, and in order to allow water to communicate with the inside thereof, as shown in FIG. 11, a through hole 29b is provided near one end of the elongated conductor rod 3Ca so that by allowing the through hole 29b to face one of cooling water manifolds 22, cooling water is allowed to flow between one of the cooling water manifolds 22 and the through hole 29b. In other words, the cooling water flows into the one end of the through hole 3Cg inside the elongated conductor rod 3Ca via the through hole 29b from one of the cooling water manifolds 22 inside one of the counter bores formed at the resin case 18, and flows out toward the other one of the cooling water manifolds 22 inside the other one of the counter bores formed on the resin case 18 after passing through the through hole 29a and the outer counter bore 17d of the other brass block 17, from the other end of the through hole 3Cg inside the elongated conductor rod 3Ca.

As shown in FIG. 12, the plurality of conductor rods 3C are connected to one another by the conductor links 23 to form a spiral shape with three turns as a whole, and have a structure in which the inner space of the spiral shape and the space inside the cylindrical chamber 7 are overlapped with each other.

In this structure, since the length dimension in the longitudinal direction of the plasma jetting port 12 is made equal to or longer than the width dimension of the base material 2, the entire thin film 16 near the surface of the base material 2 can be plasma-processed by a scanning process at one time (with the torch unit T3 and the base material placing table 1 being relatively moved).

In such a plasma processing apparatus, while supplying an Ar or Ar+H$_2$ gas into the cylindrical chamber 7 as a plasma gas and a sheath gas from the plasma gas supply holes 9 and the sheath gas supply holes 11, with an N$_2$ gas being supplied from the shield gas introducing port 13a as a shield gas, a high-frequency power of 13.56 MHz is supplied to the conductor rods 3C configuring the coil 3Cb from the high-frequency power supply 91, with the plasma gas and the sheath gas being jetted from the plasma jetting port 12 toward the base material 2; thus, a plasma is generated in the cylindrical chamber 7 so that desired atoms or molecules can be doped into the semiconductor thin film 16 over the entire region to be desirably processed of the base material 2 by irradiating and scanning the base material 2 with the plasma from the plasma jetting port 12. Simultaneously, the semiconductor can be activated. Moreover, pn-junctions can be realized by using a simple structure in a semiconductor device, a solar battery, a liquid crystal panel, or the like.

In the inductive coupling type plasma torch used in the third embodiment, since the cylindrical chamber 7 and the base material placing table 1 are relatively moved in a direction perpendicular to the longitudinal direction of the plasma jetting port 12, with the longitudinal direction of the plasma jetting port 12 and the surface of the base material placing table 1 being disposed in parallel with each other, the length dimension of a plasma to be generated and the processing length dimension of the base material 2 are made substantially equal to each other. In this case, the width dimension of the cross section of the cylindrical chamber 7 taken along a plane perpendicular to its center axis (the width dimension of the inner space of the chamber 7 in FIG. 7B) may be desirably set to be larger even by a slight degree than the width dimension of the plasma jetting port 12 (the length dimension of the gap in FIG. 7B). That is, the volume of a plasma to be generated can be made extremely small. As a result, this system can provide a superior power efficiency.

Moreover, in the inner space of the cylindrical chamber 7, since a relatively uniform plasma relative to the direction of the center axis can be generated, the plasma is made uniform in the longitudinal direction so that the base material 2 can be processed uniformly.

Fourth Embodiment

Figure 13:
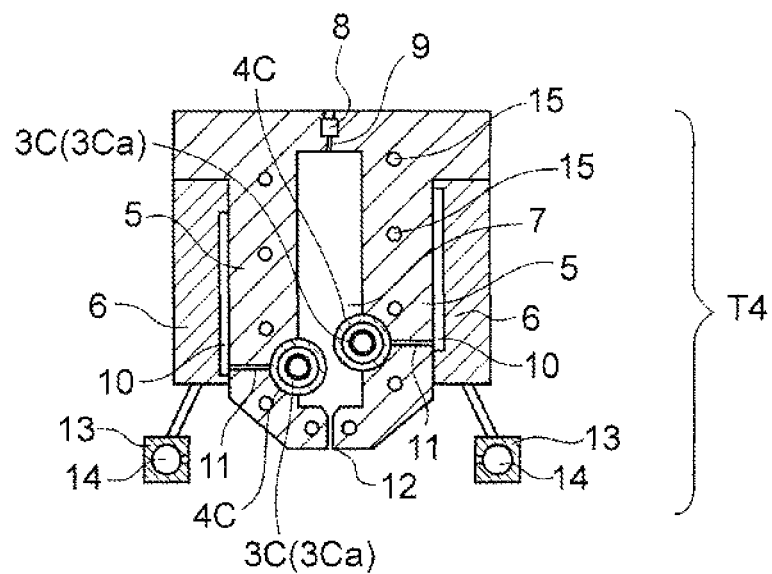
FIG. 13 is a cross-sectional view that shows a structure of a plasma doping apparatus in accordance with a fourth embodiment of the present invention.

Referring to FIG. 13, the following description will refer to a fourth embodiment of the present invention.

FIG. 13, which shows a structure of a plasma doping apparatus in the fourth embodiment of the present invention, is a cross-sectional view taken along a plane perpendicular to the longitudinal direction of an inductive coupling type plasma torch unit T4. Since the fourth embodiment of the present invention is different from the third embodiment only in the numbers of the conductor rods 3C and the quartz pipes 4C, the description of the structures other than these features will not be repeated.

In FIG. 13, only two conductor rods 3 (that is, two conductor rods at the lower end on the right side and at the lower end on the left side in FIG. 13) are provided, and both of the two conductor rods 3C are configured as long conductor rods 3Ca. These two conductor rods 3Ca are electrically connected to each other by the conductor link 23 so that a coil with one turn is formed.

In this structure, a volume of a plasma to be generated is made smaller than that of the third embodiment, so that the torch unit T4 that is superior in power efficiency can be realized.

Fifth Embodiment

Figure 14:
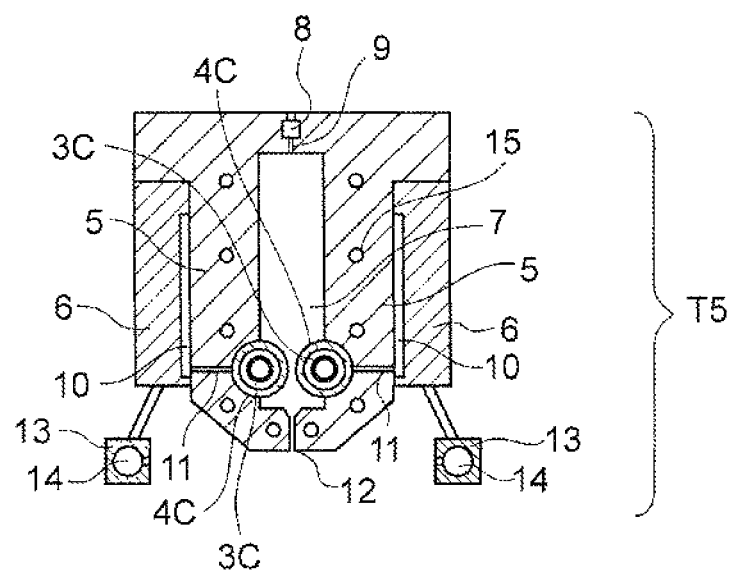
FIG. 14 is a cross-sectional view that shows a structure of a plasma doping apparatus in accordance with a fifth embodiment of the present invention.

Referring to FIG. 14, the following description will refer to a fifth embodiment of the present invention.

FIG. 14, which shows a structure of a plasma doping apparatus in the fifth embodiment of the present invention, is a cross-sectional view taken along a plane perpendicular to the longitudinal direction of an inductive coupling type plasma torch unit T5. Since the fifth embodiment of the present invention is different from the fourth embodiment only in the layouts of the conductor reds 3C and the quartz pipes 4C, the description of the structures other than these features will not be repeated.

In FIG. 14, since the two conductor rods 3C are disposed at positions having the same height, the same distance is kept from the jetting port 12, and these conductor rods are connected with each other by the conductor link 23 so as to form a coil with one turn.

In this structure, a volume of a plasma to be generated is made smaller than that of the fourth embodiment, so that the torch unit T5 that is superior in power efficiency can be realized.

Sixth Embodiment

Figure 15:
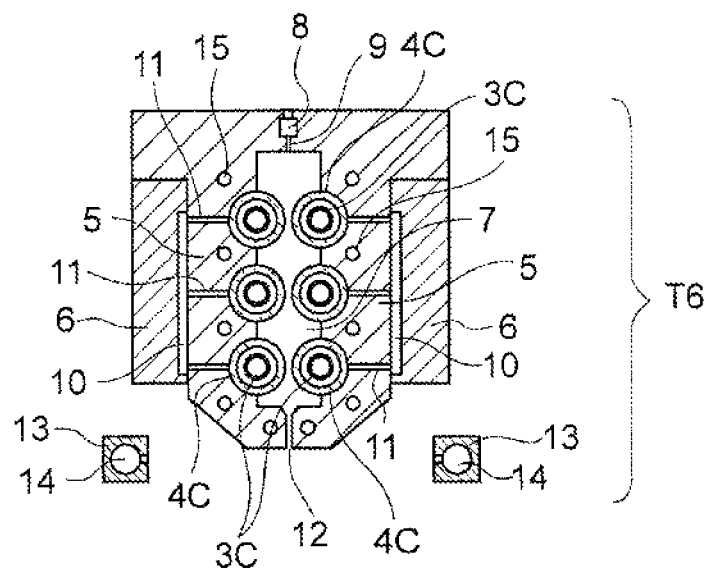
FIG. 15 is a cross-sectional view that shows a structure of a plasma doping apparatus in accordance with a sixth embodiment of the present invention.
Figure 16:
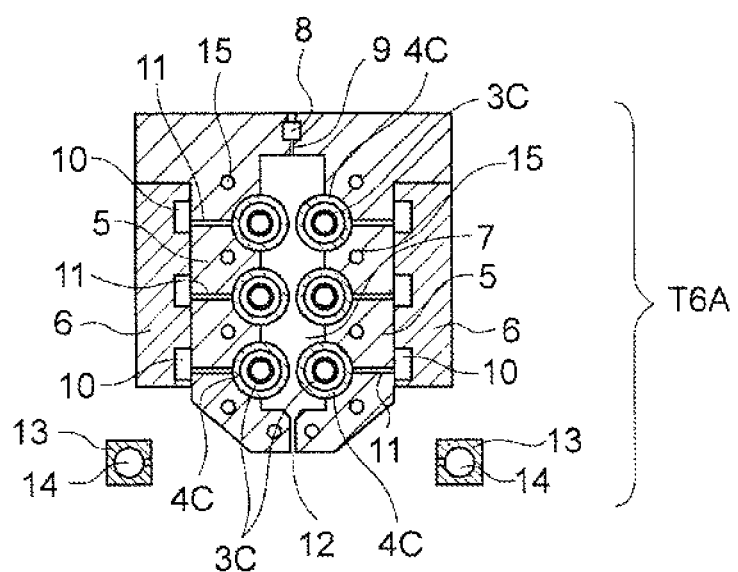
FIG. 16 is a cross-sectional view that shows the structure of the plasma doping apparatus in accordance with the sixth embodiment of the present invention.

Referring to FIGS. 15 and 16, the following description will refer to a sixth embodiment of the present invention.

FIG. 15, which shows a structure of a plasma doping apparatus in the sixth embodiment of the present invention, is a cross-sectional view taken along a plane perpendicular to the longitudinal direction of an inductive coupling type plasma torch unit T6. Since the sixth embodiment of the present invention is different from the third embodiment only in the layouts of the conductor rods 3C and the quartz pipes 4C, the description of the structures other than these features will not be repeated.

In FIG. 15, with respect to six conductor rods 3C, three conductor rods 3C are disposed each on the right and left sides with the same height, so that each of pairs of rods are disposed at the same distance from the jetting port 12, and these conductor rods are connected with one another by the conductor links 23 so as to form a coil with three turns.

Alternatively, by connecting respective pairs to different high-frequency power supplies, the power to be supplied to each of the pairs can be controlled independently.

Moreover, as shown in FIG. 16, as an inductive coupling type torch unit T6A, the sheath gas manifold 10 and the sheath gas supply hole 11 may be configured as different systems for each of the pairs. With this arrangement, the minimum sheath gas flow rate required can be provided to each of the pairs.

Alternatively, the independent control of the power to be supplied to each of the pairs and the provision of the sheath gas manifold 10 and the sheath gas supply hole 11 as different systems for each of the pairs can be simultaneously realized. In this case, different kinds of gases can be supplied to the respective systems, and by controlling their degrees of ionization by the power balance, it is possible to provide plasma processing that is more superior in controllability.

Seventh Embodiment

Figure 17A:
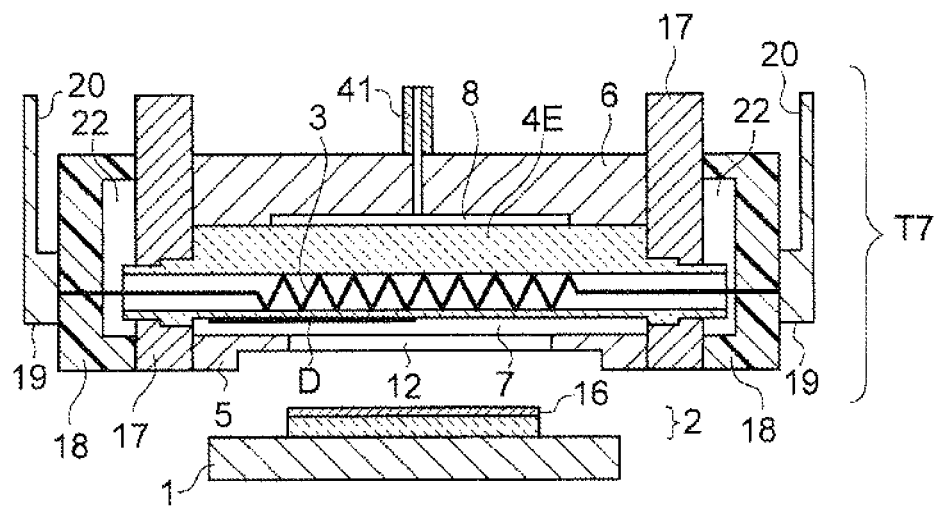
FIG. 17A is a cross-sectional view that shows a structure of a plasma doping apparatus in accordance with a seventh embodiment of the present invention.

Referring to FIG. 17A, the following description will refer to a seventh embodiment of the present invention.

FIG. 17A, which shows a structure of an inductive coupling type plasma torch unit T7 of a plasma doping apparatus in the seventh embodiment of the present invention, is a cross-sectional view taken along a plane that includes the center axis of the solenoid coil 3 and is perpendicular to the surface of the base material 2. Since the seventh embodiment of the present invention is different from the first embodiment only in the surface structure of the quartz pipe 4, the description of the structures other than this feature will not be repeated.

In FIG. 17A, a boron glass film D is formed on one portion of the surface of a quartz pipe 4E (a left half portion from the center of the torch in FIG. 17A). By carrying out a plasma doping process in this structure, only the half portion of the semiconductor thin film 16 can be doped with boron atoms. That is, one portion of a member defining a space in which a plasma is generated is made of a material containing the atoms or molecules so that the atoms or molecules can be doped partially in the semiconductor.

Although this arrangement is exemplified by a structure in which the boron glass film D is formed on one portion of the surface of the quartz pipe 4S so as to dope the boron atoms therein, it is needless to say that the boron film may be formed on one portion of the surface of the brass block 5 or that a material to be formed on one portion of the surface of the quartz block 4E or the brass block 5 may be appropriately selected depending on the atoms or molecules to be desirably doped.

At this time, in the case when an n-type semiconductor film is used as the semiconductor thin film 16, since only the half portion of the semiconductor film is modified into a p-type film by the plasma doping process, a solar battery having a structure in which the n-type and p-type semiconductors are exposed to one surface of a base material, that is, a so-called back contact-type solar battery, can be formed.

Figure 17B:
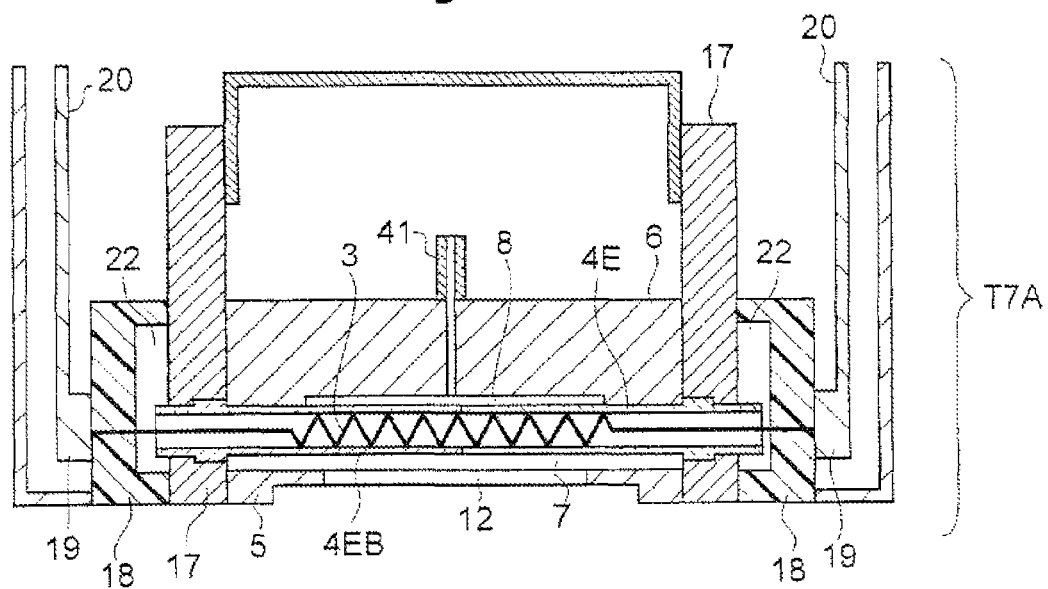
FIG. 17B is a cross-sectional view that shows a structure of a plasma doping apparatus in accordance with a modified example of the seventh embodiment of the present invention.

FIG. 17B, which shows a structure of an inductive coupling type plasma torch unit T7A of a plasma doping apparatus in a modified example of the seventh embodiment of the present invention, is a cross-sectional view taken along a plane that includes the center axis of the solenoid coil 3 and is perpendicular to the base material 2. Since the modified example of the seventh embodiment of the present invention is different from the seventh embodiment only in the structure of the quartz pipe 4, the description of the structures other than this feature will not be repeated.

In FIG. 17B, boron is contained in one portion of the quartz pipe 4E (a left half portion from the center of the torch in FIG. 17B). The portion containing boron is indicated by a different hatched portion 4E8. By carrying out a plasma doping process in this structure, only the half portion of the semiconductor thin film 16 can be doped with boron atoms. That is, one portion of a member defining a space in which a plasma is generated is made of a material containing the atoms or molecules, so that the atoms or molecules can be doped partially in the semiconductor. By allowing only the half portion in the longitudinal direction of the quartz pipe 4E to contain an impurity, the doping process can be carried out simultaneously with the entire surface crystallization and activation, etc., so that it is possible to manufacture a back contact-type solar battery.

Moreover, by applying B and P thereto in a line pattern, p+ and n+ may be formed on the p-substrate simultaneously. A material including powder of B and P may be applied onto the entire portion of which the plasma is generated. These may enhance dose amount reproducibility.

Eighth Embodiment

Figure 18:
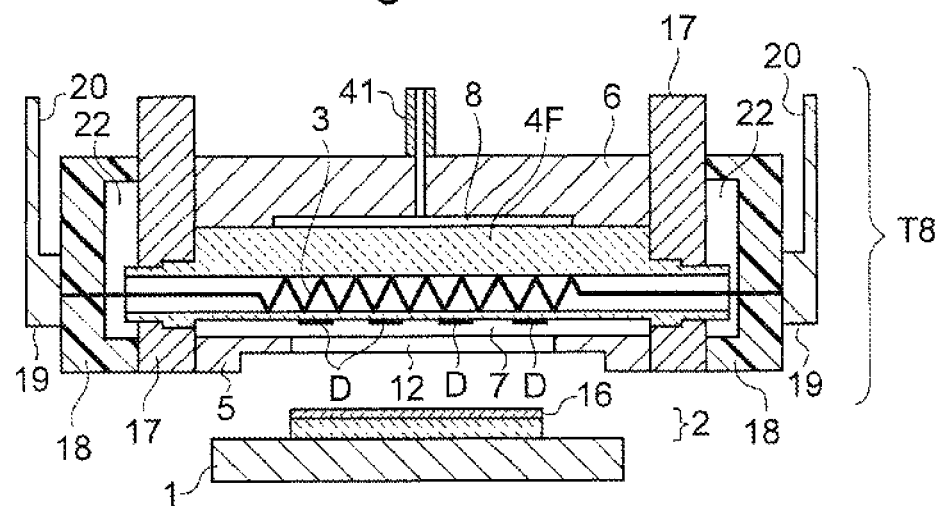
FIG. 18 is a cross-sectional view that shows a structure of a plasma doping apparatus in accordance with an eighth embodiment of the present invention.

Referring to FIG. 18, the following description will refer to an eighth embodiment of the present invention.

FIG. 18, which shows a structure of an inductive coupling type plasma torch unit T8 of a plasma doping apparatus in the eighth embodiment of the present invention, is a cross-sectional view taken along a plane that includes the center axis of the solenoid coil 3 and is perpendicular to the surface of the base material 2. Since the eighth embodiment of the present invention is different from the first embodiment only in the surface structure of the quartz pipe 4, the description of the structures other than this feature will not be repeated.

In FIG. 18, the boron glass film D is intermittently formed on one portion of the surface of the quartz pipe 4. With this arrangement, by carrying a plasma doping process, it is possible to dope only one portion of the semiconductor film 16 with boron atoms in a stripe pattern.

Although this arrangement is exemplified by a structure in which the boron glass film D is formed on one portion of the surface of the quartz pipe 4 so as to dope the boron atoms therein, it is needless to say that the boron film may be intermittently formed on one portion of the surface of the brass block 5 or that a material to be intermittently formed on one portion of the surface of the quartz pipe 4 or the brass block 5 may be appropriately selected depending on the atoms or molecules to be desirably doped.

At this time, in the case when an n-type semiconductor film is used as the semiconductor thin film 16, since only one portion of the semiconductor film is modified into a p-type film in a stripe pattern by the plasma doping process, a solar battery having a structure in which the n-type and p-type semiconductors are exposed to one surface of the base material 2, that is, a so-called back contact-type solar battery, can be formed.

Alternatively, by forming the boron glass film D intermittently on one portion of the surface of the quartz pipe 4, while forming a phosphorus glass film intermittently on another portion of the surface of the quartz pipe 4, it is possible to dope boron atoms and phosphorus atoms in a stripe pattern. In other words, in this structure, one portion of a member defining a space in which a plasma is generated may be made of a material containing atoms or molecules (boron), while another portion different from the above-mentioned portion of the member is made of a material containing other atoms or molecules (phosphorus) different from the above-mentioned atoms or molecules, so that the above-mentioned atoms or molecules (boron) are partially doped in the semiconductor, with the other portion different from the above-mentioned portion of the semiconductor being doped with the other atoms or molecules (phosphorus). With this arrangement, it is possible to dope a plurality of portions with respectively different substances.

At this time, in the case when an n-type semiconductor film is used as the semiconductor thin film 16, portions doped with boron by the plasma doping process are modified into p-type portions in a stripe pattern, while the other portions are modified into n+ type portions in a stripe pattern. In other words, a solar battery having a structure in which the n-type and p+-type semiconductors are exposed to one surface of the base material 2, that is, a so-called back contact-type solar battery, can be formed.

Ninth Embodiment

Figure 19A:
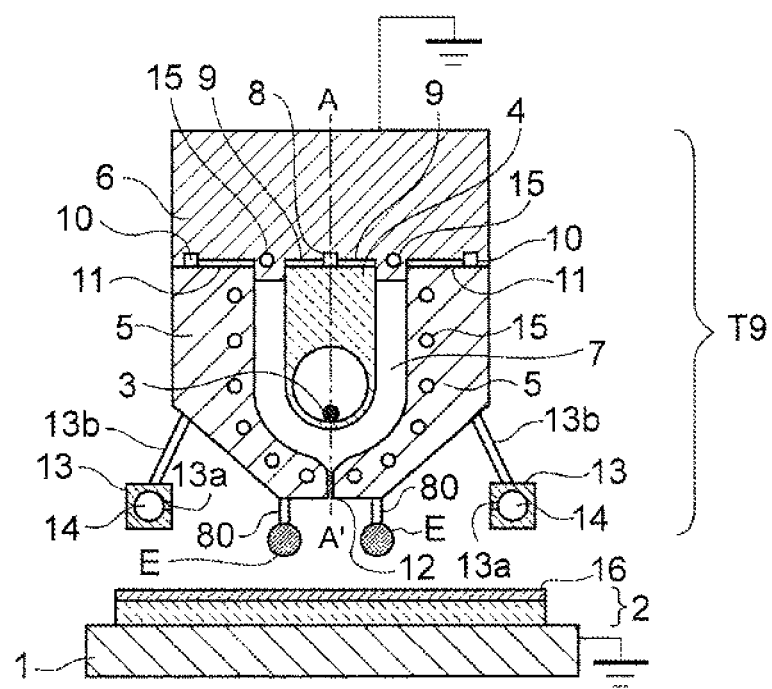
FIG. 19A is a longitudinal cross-sectional side view that shows a structure of a plasma doping apparatus in accordance with a ninth embodiment of the present invention.
Figure 19C:
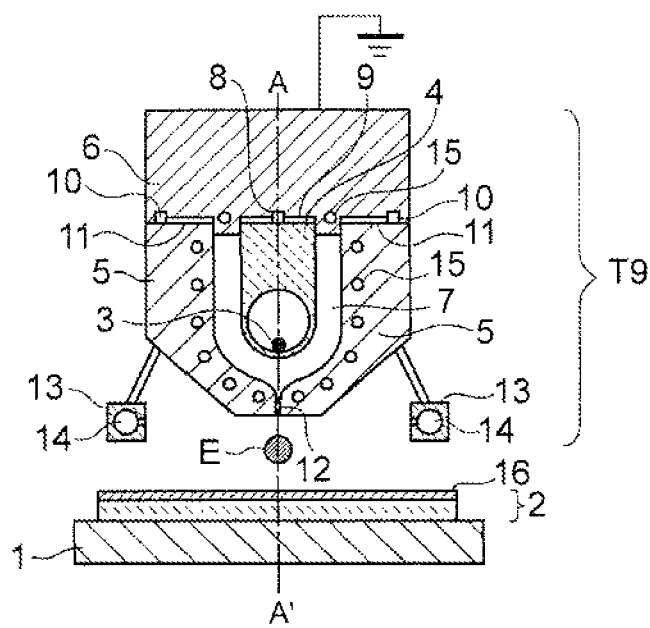
FIG. 19C is a cross-sectional view that shows a structure of a plasma doping apparatus in accordance with a first modified example of the ninth embodiment of the present invention.
Figure 19B:
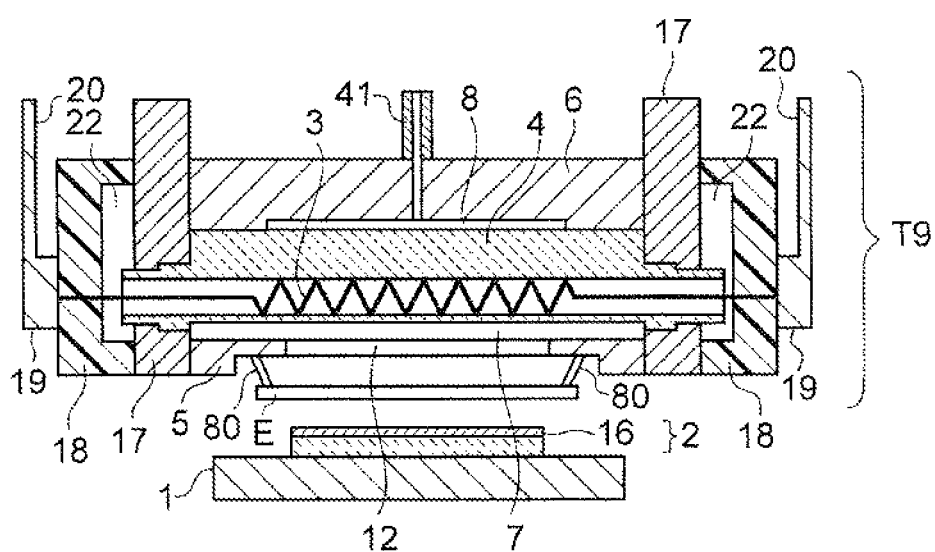
FIG. 19B is a longitudinal cross-sectional front view that shows the structure of the plasma doping apparatus in accordance with the ninth embodiment of the present invention.

Referring to FIGS. 19A and 19B, the following description will refer to a ninth embodiment of the present invention.

FIG. 19A, which is a longitudinal cross-sectional side view showing a structure of a plasma doping apparatus in accordance with the ninth embodiment of the present invention, is a cross-sectional view taken along a plane perpendicular to the longitudinal direction of an inductive coupling type plasma torch unit T9. FIG. 19B is a longitudinal cross-sectional front view showing the structure of the plasma doping apparatus of the ninth embodiment of the present invention, and the longitudinal cross-sectional front view is taken along a broken line A-A' of FIG. 19A. Since the ninth embodiment of the present invention is different from the first embodiment only in that impurity rods E are added thereto as one example of an elongated member, the description of the structures other than this feature will not be repeated.

In FIGS. 19A and 19B, the impurity rods E supported by impurity-rod supporting members 80 from the inductive coupling type plasma torch unit T9, are provided between the inductive coupling type plasma torch unit T9 and the base material 2. Each of the impurity rods E, which is a rod extending in the elongated direction (longitudinal direction) of the torch T9, has a length longer than the plasma jetting port 12, and is made of a substance containing impurity atoms or molecules to be desirably doped in the base material 2. In this case, it is not necessary to coat the inner wall surface of the cylindrical chamber 7 with the substance containing the desired impurity atoms or molecules, for example, with a thickness of 100 nm or more, and by irradiating the impurity rods E with a plasma jetted from the plasma jetting port 12, sublimation or chemical etching is caused so that the desired atoms or molecules are supplied into a gaseous phase and doped in the semiconductor thin film 16 on the surface of the base material 2.

This structure is advantageous in that it is possible to prevent a change in doping concentration which tends to occur when the coating on the inner wall surface of the cylindrical chamber 7 deteriorates due to etching or the like. Since the impurity rods E are placed not inside the cylindrical chamber 7 of the torch T9, but outside the torch T9, this can be easily exchanged after a predetermined lapse of processing time, and it is possible to provide a structure in which, while the impurity rods E, supported in a manner so as to move in the longitudinal direction of the torch T9, is being gradually fed in the longitudinal direction, its new impurity surface may be always exposed to a plasma.

The ninth embodiment has exemplified the structure in which each of, the impurity rods E is placed with a slight offset from a position right below the plasma jetting port 12, and this structure is advantageous in that a flow of the plasma from the plasma jetting port 12 toward the base material 2 is not disturbed. Of course, the impurity rod E may be placed right below the plasma jetting port 12 depending on the characteristics of the processing (see a first modified example of the ninth embodiment in FIG. 19C). Although this embodiment has exemplified the structure in which two impurity rods E are disposed, one of them (see FIG. 19C) or three or more of them may be provided.

Moreover, another structure may be proposed in which a heater is embedded into the impurity rod E and the process is carried out while being heated. In contrast, a coolant channel may be formed inside the impurity rod E so that the process is carried out while being cooled.

Figure 19D:
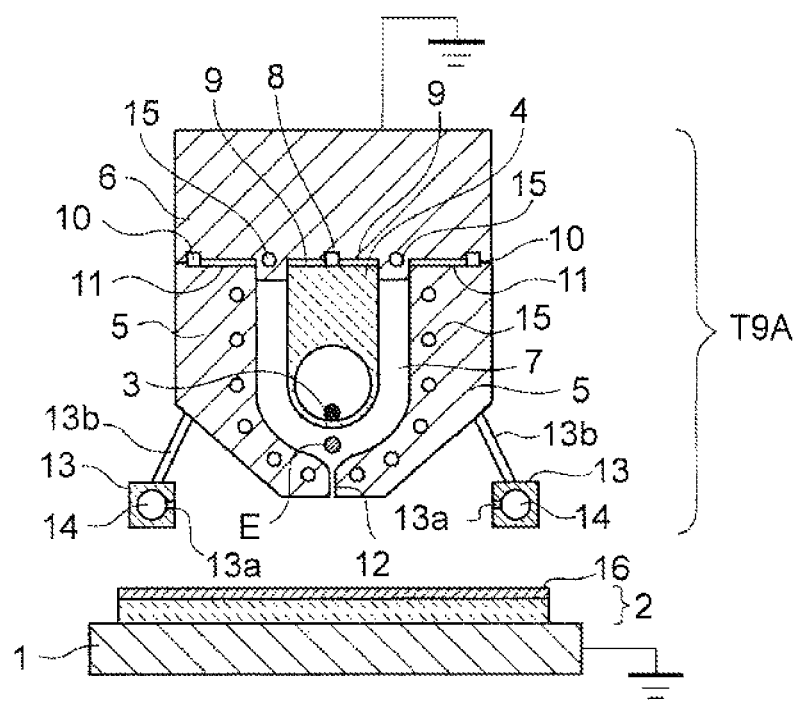
FIG. 19D is a cross-sectional view that shows a structure of a plasma doping apparatus in accordance with a second modified example of the ninth embodiment of the present invention.

FIG. 19D is a cross-sectional view that shows a structure of a plasma doping apparatus in accordance with a second modified example of the ninth embodiment of the present invention, and the cross-sectional view is taken along a plane perpendicular to the longitudinal direction of an inductive coupling type plasma torch unit T9A. Since this modified example of the ninth embodiment of the present invention is different from the ninth embodiment only in that one impurity rod E is disposed on a lower portion inside the cylindrical chamber 7, the description of the structures other than this feature will not be repeated.

In the same manner as in the ninth embodiment, the impurity rod E is extending in the elongated direction (longitudinal direction) of the torch T9A, and is made of a substance containing impurity atoms or molecules to be desirably doped in the base material 2. In this case also, it is not necessary to coat the inner wall surface of the cylindrical chamber 7 with the substance containing the desired impurity atoms or molecules, with a thickness of, for example, 100 nm or more, and by making the impurity rod E in contact with a plasma prior to being jetted from the plasma jetting port 12, sublimation or chemical etching is caused so that the desired atoms or molecules are supplied into a gaseous phase, and by irradiating the semiconductor thin film 16 on the surface of the base material 2 with the plasma jetted from the plasma jetting port 12, a doping process can be carried out.

This structure is advantageous in that it is possible to prevent a change in doping concentration which tends to occur when the coating on the inner wall surface of the cylindrical chamber 7 deteriorates due to etching or the like. Since the impurity rod E is provided not as coating on the inner wall surface of the cylindrical chamber 7 of the torch T9A, but as a separated member inside the cylindrical chamber 7, this rod can be relatively easily exchanged after a predetermined lapse of processing time.

Moreover, another structure may be proposed in which a heater is embedded into the impurity rod E and the process is carried out while being heated. In contrast, a coolant channel is formed inside the impurity rod E so that the process may be carried out while being cooled.

Tenth Embodiment

Figure 20B:
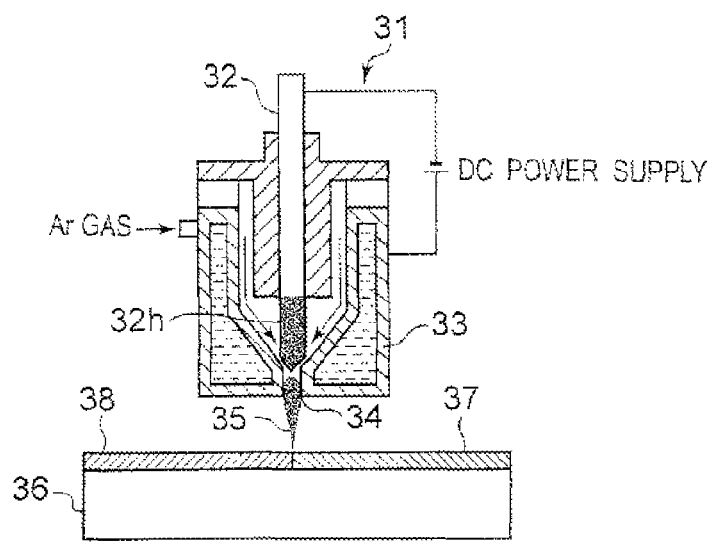
FIG. 20B is a cross-sectional view that shows a structure of a plasma doping apparatus in accordance with a modified example of the tenth embodiment of the present invention.
Figure 20A:
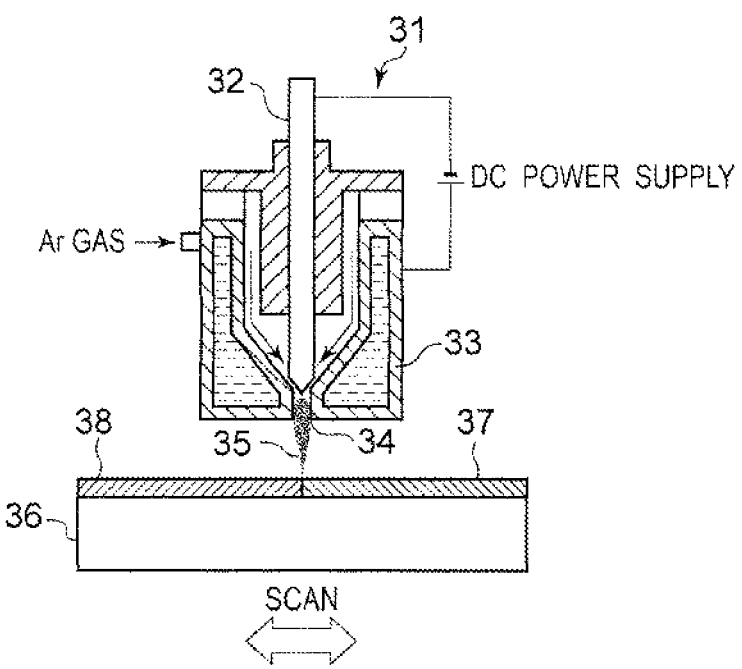
FIG. 20A is a cross-sectional view that shows a structure of a plasma doping apparatus in accordance with a tenth embodiment of the present invention.

Referring to FIG. 20A, the following description will refer to a tenth embodiment of the present invention.

FIG. 20A is a cross-sectional view that shows a structure of a plasma doping apparatus in accordance with the tenth embodiment of the present invention. In FIG. 20A, a DC torch unit 31 configuring the plasma doping apparatus is configured by a cathode 32 and an anode 33 that is disposed so as to face the cathode 32 with a predetermined distance therefrom. The cathode 32 is made of, for example, boron. The anode 33 is made of a conductor such as, for example, copper. Moreover, the cathode 33 is configured to have a hollow structure, and by allowing water to pass through this hollow portion, it can be cooled. A jetting hole (nozzle) 34 is formed in the anode 33. When a direct current (DC) voltage is applied to between the cathode 32 and the anode 33, an arc discharge is generated between the two electrodes. Since the cathode 32 is made of boron, desired atoms (boron) to be doped are generated from a solid material configuring the cathode 32 by sublimation caused by the heat of the arc plasma. In this manner, the CC torch may be used. A substance containing desired atoms, such as boron glass, may be coated on the surface of the anode 33 with a thickness of, for example, 100 nm or more.

Moreover, as shown in FIG. 20B as a modified example, not the entire portion of the cathode 32 is made of boron, but only a tip portion 32h of the cathode 32 may be allowed to contain an impurity (for example, boron) to be desirably doped into the base material 2.

Eleventh Embodiment

Figure 21A:
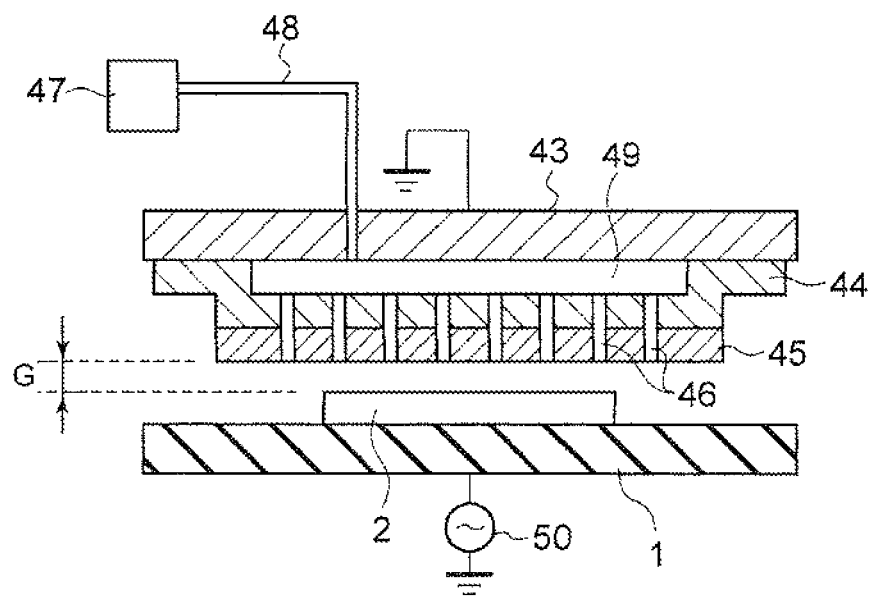
FIG. 21A is a cross-sectional view that shows a structure of a plasma doping apparatus in accordance with an eleventh embodiment of the present invention.

Referring to FIG. 21A, the following description will refer to an eleventh embodiment of the present invention.

FIG. 21A is a cross-sectional view that shows a structure of a plasma doping apparatus in accordance with the eleventh embodiment of the present invention. In FIG. 21A, a silicon base material 2 as one example of a base material is placed on a substrate electrode 1 serving as a base material placing table. An opposed electrode 43 is formed so as to face the substrate electrode 1, and a shower electrode 44 and a shower plate 45 are provided on the opposed electrode 43. Shower holes (through holes) 46 are formed in the shower electrode 44 and the shower plate 45 at mutually corresponding positions. A gas is supplied to a gas reservoir 49 that is a space formed between the opposed electrode 43 and the shower electrode 44 from the gas supply device 47 through a pipe 48, and through the shower holes 46 that communicate with the gas reservoir 49, the gas supplied to the gas reservoir 49 is jetted onto the base material 2. By supplying a high-frequency power of 13.56 MHz to the substrate electrode 1 from a high-frequency power supply 50 in this state, a plasma is generated between the shower plate 45 and the base material 2. The respective constituent components are placed in the atmospheric pressure, and it is not necessary to provide a strong completely closed container, such as a vacuum container, and a vacuum pump. A gap G provided between the shower plate 45 and the base material 2 is preferably set to 0.3 mm to 5 mm. In both of the cases when the gap G is too narrow and when it is too wide, ignition failure of a discharge tends to occur.

Boron glass is coated on the surface of the shower plate 45 (one portion of a member defining a space in which a plasma is generated) as a substance containing an element (boron) to be desirably doped into the base material 2, with a thickness of, for example, 100 nm or more. By using a gas containing hydrogen, hydrogen radicals that are activator species obtained by ionizing the hydrogen gas are allowed to react with the surface of the shower plate 45, so that $B_xH_y$ is generated from a solid substance configuring the surface of the shower plate 45 by chemical etching. Therefore, boron that is a decomposition product of these can be doped. In this manner, a parallel plate-type atmospheric pressure plasma source can be used as well. However, in this structure, since the generation of a thermal plasma is not expected, it becomes difficult to simultaneously carry out the activation.

Figure 21B:
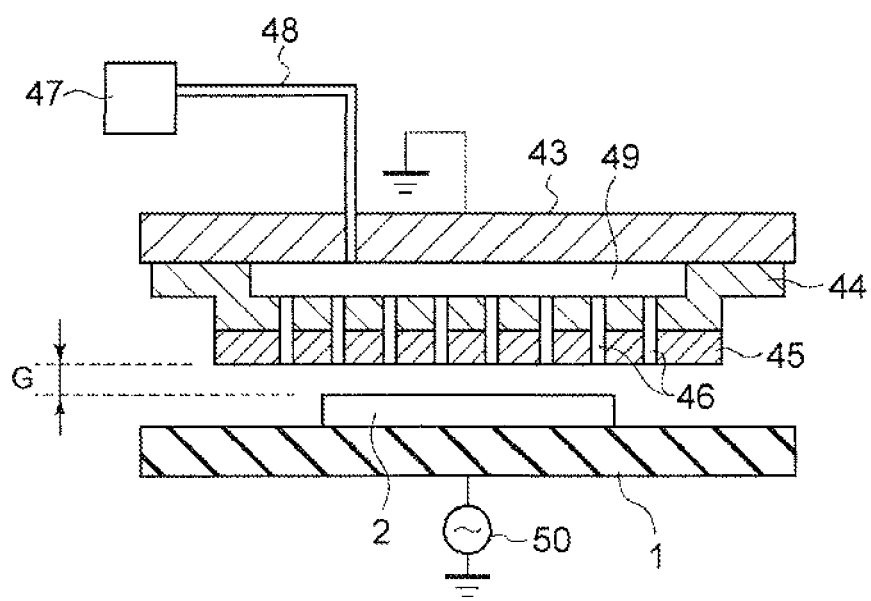
FIG. 21B is a cross-sectional view that shows a structure of a plasma doping apparatus in accordance with a modified example of the eleventh embodiment of the present invention.
Figure 22:
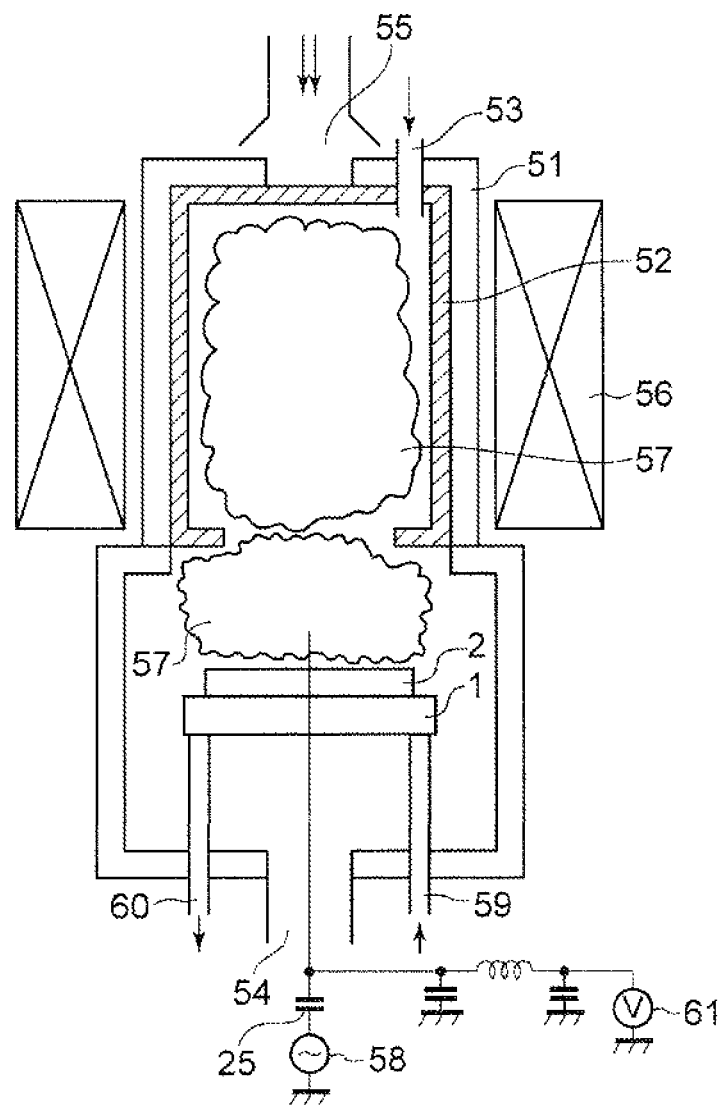
FIG. 22 is a cross-sectional view that shows a structure of a conventional plasma doping apparatus.

Moreover, as shown in FIG. 21B as a modified example, instead of coating, the shower plate 45 itself may be allowed to contain an impurity element (for example, boron) to be desirably doped in the base material 2.

The above-mentioned plasma doping methods and apparatuses described according to the first embodiment to the eleventh embodiment are exemplary only showing the typical examples within the applicable scope of the present invention.

For example, substantially all the portion of a member defining a space (cylindrical chamber 7) in which a plasma is generated may be made of a material that contains desired atoms or molecules. With this arrangement, it becomes possible to suppress undesired impurities from being mixed (contamination), and consequently to carry out a stable process for a long period of time.

Instead of allowing the member defining the space (cylindrical chamber 7) in which a plasma is generated to be coated with or include a substance containing a desired element, powder containing the desired atoms or molecules may be supplied into the space (cylindrical chamber 7) in which a plasma is generated from a powder supply device 84 (see FIG. 1A). More specifically, powder containing the desired atoms or molecules is supplied from the powder supply device 84 (see FIG. 1A) to the plasma gas supply device 90 so that the powder containing the desired atoms or molecules may be supplied into the cylindrical chamber 7 from the plasma gas supply device 90 together with the gas. With this arrangement, since the plasma generation device can be prevented from being deteriorated, a stable process can be carried out for a long period of time.

Moreover, the scanning process may be carried out with the plasma torch units T to T9 being moved by the moving device 94 with respect to the fixed base material placing table 1; however, the scanning process may be carried out with the base material placing table 1 being moved by the moving device with respect to the fixed plasma torch units T to T9.

As described above, the present invention relates to an impurity introducing layer, a junction, and other processed products, and is, in particular, effectively applied to a formation of a junction for use in forming an electronic element on a semiconductor substrate used in a semiconductor device, a solar battery, or the like, and a formation of a junction for use in forming an electronic element on a substrate with a semiconductor thin film formed on its surface and used in a liquid crystal panel, a solar battery, or the like.

Among the above-mentioned various embodiments or modifications, by appropriately combining desired embodiments or modifications with one another, the respective effects thereof can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma doping apparatus comprising:
   a casing that forms a cylindrical chamber having a slit-shaped opening portion, with a longitudinal direction of the opening portion and a longitudinal direction of the cylindrical chamber being set in parallel with each other;
   a gas supply device that supplies a gas into the chamber;
   a coil for use in generating a high-frequency electromagnetic field in the chamber;
   a high-frequency power supply for supplying a high-frequency power to the coil;
   a base material placing table disposed to face the opening portion, on which a base material is placed;
   a moving device that relatively moves the chamber and the base material placing table relative to each other in a direction perpendicular to a longitudinal direction of the opening portion; and
   an elongated member provided at least at one portion of an inner wall surface of the cylindrical chamber, or between the cylindrical chamber and the base material placing table, the member extending in the longitudinal direction of the cylindrical chamber, and being made of a material containing atoms or molecules to be doped, wherein
   the atoms or molecules are doped in a semiconductor configuring a surface of the base material.

2. The plasma doping apparatus according to claim 1, wherein the coil is a solenoid coil, and an extending direction of the coil and the longitudinal direction of the opening portion are set in parallel with each other.

3. The plasma doping apparatus according to claim 1, wherein
   the coil is configured by connecting a plurality of conductor rods disposed in parallel with the longitudinal direction of the cylindrical chamber with one another, by using a conductor link disposed perpendicularly to the longitudinal direction of the cylindrical chamber,
   the conductor rods are inserted into dielectric pipes, and
   one portions of the dielectric pipes are disposed so as to be exposed to a space inside the cylindrical chamber.

4. The plasma doping apparatus according to claim 1, wherein one portion of an inner wall surface of the cylindrical chamber is made of a material containing the atoms or molecules, another portion different from the one portion of the inner wall surface of the cylindrical chamber is made of a material containing other atoms or molecules different from the atoms or molecules.

5. The plasma doping apparatus according to claim 1, wherein substantially an entire portion of the inner wall surface of the cylindrical chamber is made of a material containing the atoms or molecules.

6. The plasma doping apparatus according to claim 1, wherein, by supplying the high-frequency power to the coil from the high-frequency power supply, the atoms or molecules are generated from a solid substance by sublimation caused by heat of a plasma or by chemical etching caused by activator species in the plasma, and by irradiating the base material whose surface is a semiconductor with the plasma, the atoms or molecules are doped in the semiconductor and the semiconductor is simultaneously heated to an activatable temperature so as to be activated.

* * * * *